(12) United States Patent
McFarlane et al.

(10) Patent No.: US 11,688,832 B2
(45) Date of Patent: Jun. 27, 2023

(54) LIGHT-ALTERING MATERIAL ARRANGEMENTS FOR LIGHT-EMITTING DEVICES

(71) Applicant: CreeLED, Inc., Durham, NC (US)

(72) Inventors: Tucker McFarlane, Morrisville, NC (US); Matthew Brady, Raleigh, NC (US); Derek Miller, Raleigh, NC (US); Colin Blakely, Raleigh, NC (US)

(73) Assignee: CreeLED, Inc., Durham, NC (US)

( * ) Notice: Subject to any disclaimer, the term of this patent is extended or adjusted under 35 U.S.C. 154(b) by 0 days.

(21) Appl. No.: 16/850,540

(22) Filed: Apr. 16, 2020

(65) Prior Publication Data

US 2021/0328112 A1    Oct. 21, 2021

(51) Int. Cl.
*H01L 33/50*    (2010.01)
*H01L 25/075*   (2006.01)
(Continued)

(52) U.S. Cl.
CPC ........ *H01L 33/502* (2013.01); *H01L 25/0753* (2013.01); *H01L 33/56* (2013.01); *H01L 33/60* (2013.01)

(58) Field of Classification Search
CPC ....... H01L 33/502; H01L 33/60; H01L 33/56; H01L 25/0753
See application file for complete search history.

(56) References Cited

U.S. PATENT DOCUMENTS 8,866,169 B2   10/2014   Emerson et al.
9,070,850 B2    6/2015   Keller et al.
(Continued)

FOREIGN PATENT DOCUMENTS

EP   2804225 A1   11/2014
EP   3633744 A1    4/2020

OTHER PUBLICATIONS

Invitation to Pay Additional Fees and Partial Search for International Patent Application No. PCT/US2021/027179, dated Jul. 28, 2021, 16 pages.
(Continued)

*Primary Examiner* — Jay C Chang
*Assistant Examiner* — Mikka Liu
(74) *Attorney, Agent, or Firm* — Withrow & Terranova, P.L.L.C.

(57) ABSTRACT

Solid-state lighting devices and more particularly light-emitting devices including light-emitting diodes (LEDs) with light-altering material arrangements are disclosed. LED devices may include light-altering materials that are provided around peripheral sidewalls of LED chips without the need for a supporting submount or lead frame. The light-altering materials may be provided with reduced thicknesses along peripheral sidewalls of LED chips. An exemplary LED device as disclosed herein may be configured with a footprint that is close to a footprint of the LED chip within the LED device while also providing an amount of light-altering material around peripheral edges of the LED chip to reduce cross-talk. Accordingly, such LED devices may be well suited for use in applications where LED devices form closely-spaced LED arrays. Fabrication techniques are disclosed that include laminating a preformed sheet of light-altering material on one or more surfaces of the LED chip.

24 Claims, 11 Drawing Sheets

(51) Int. Cl.
  *H01L 33/56* (2010.01)
  *H01L 33/60* (2010.01)

(56) References Cited

U.S. PATENT DOCUMENTS

| | | |
|---|---|---|
| 9,461,201 B2 | 10/2016 | Heikman et al. |
| 9,887,327 B2 | 2/2018 | Reiherzer et al. |
| 10,468,565 B2 | 11/2019 | Pun et al. |
| 2006/0291217 A1* | 12/2006 | Vanderschuit ......... A63H 33/22 362/363 |
| 2011/0049545 A1* | 3/2011 | Basin ...................... H01L 24/97 257/E33.061 |
| 2011/0248315 A1* | 10/2011 | Nam ...................... B82Y 10/00 257/E31.124 |
| 2016/0079486 A1 | 3/2016 | Sugimoto et al. |
| 2016/0093780 A1* | 3/2016 | Beppu ................. H01L 21/3213 438/27 |
| 2017/0098746 A1 | 4/2017 | Bergmann et al. |
| 2018/0033924 A1 | 2/2018 | Andrews et al. |
| 2019/0157522 A1* | 5/2019 | Albrecht ............. H01L 33/0093 |
| 2019/0165226 A1* | 5/2019 | Kim ....................... H01L 33/32 |
| 2019/0304950 A1* | 10/2019 | Israel .................. H01L 33/0095 |
| 2019/0326484 A1 | 10/2019 | Welch et al. |
| 2020/0105984 A1 | 4/2020 | Damborsky et al. |
| 2020/0127171 A1* | 4/2020 | Tong ..................... H01L 33/502 |

OTHER PUBLICATIONS

International Search Report and Written Opinion for International Patent Application No. PCT/US2021/027179, dated Sep. 28, 2021, 21 pages.

\* cited by examiner

LIGHT-ALTERING MATERIAL ARRANGEMENTS FOR LIGHT-EMITTING DEVICES

FIELD OF THE DISCLOSURE

The present disclosure relates to solid-state lighting devices, and more particularly to light-altering material arrangements for light-emitting devices such as light-emitting diodes (LEDs).

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications and are being increasingly utilized for general illumination and automotive applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An LED chip typically includes an active region that may be fabricated, for example, from silicon carbide, gallium nitride, gallium phosphide, aluminum nitride, gallium arsenide-based materials, and/or from organic semiconductor materials. Photons generated by the active region are initiated in all directions.

Typically, it is desirable to operate LEDs at the highest light emission efficiency possible, which can be measured by the emission intensity in relation to the output power (e.g., in lumens per watt). A practical goal to enhance emission efficiency is to maximize extraction of light emitted by the active region in the direction of the desired transmission of light. Light extraction and external quantum efficiency of an LED can be limited by a number of factors, including internal reflection. According to the well-understood implications of Snell's law, photons reaching the surface (interface) between an LED surface and the surrounding environment are either refracted or internally reflected. If photons are internally reflected in a repeated manner, then such photons eventually are absorbed and never provide visible light that exits an LED.

LED packages, modules, and fixtures have been developed that may include multiple LED emitters that are arranged in close proximity to one another. In such applications, the LED emitters can be provided such that emissions corresponding to individual LED emitters are combined to produce desired light emissions. The emissions corresponding to individual LED emitters can be selectively generated in order to provide similar or different emission characteristics. There can be challenges in producing high quality light with desired emission characteristics when different LED emitters are provided in close proximity to one another. Additionally, conventional packaging of LED emitters may further provide spacing limitations between individual LED emitters.

The art continues to seek improved LEDs and solid-state lighting devices having desirable illumination characteristics capable of overcoming challenges associated with conventional lighting devices.

SUMMARY

The present disclosure relates to solid-state lighting devices, and more particularly to light-altering material arrangements for light-emitting devices such as light-emitting diodes (LEDs). LED devices may include light-altering materials that are provided around peripheral sidewalls of LED chips without the need for a supporting submount or lead frame. The light-altering materials may be provided with reduced thicknesses along peripheral sidewalls of LED chips. In this regard, an exemplary LED device as disclosed herein may be configured with a footprint that is close to a footprint of the LED chip within the LED device while also providing an amount of light-altering material around peripheral edges of the LED chip to reduce cross-talk. Accordingly, such LED devices may be well suited for use in applications where LED devices form closely-spaced LED arrays.

Fabrication techniques are disclosed that include laminating a preformed sheet of light-altering material on one or more surfaces of the LED chip.

In one aspect, an LED device comprises: at least one LED chip comprising a top face, a bottom face, and peripheral sidewalls that bound the top face and the bottom face; and a light-altering material arranged on the peripheral sidewalls of the at least one LED chip, the light-altering material comprising a width as measured from the peripheral sidewalls that is in a range including 15 microns (μm) and 100 μm. In certain embodiments, the width of the light-altering material is in a range including 15 μm and 50 μm. In certain embodiments, the top face of the at least one LED chip is devoid of the light-altering material. In certain embodiments, the bottom face of the at least one LED chip is devoid of the light-altering material. In certain embodiments, the light-altering material comprises a light-reflective material. In certain embodiments, the light-reflective material comprises fused silica, fumed silica, or titanium dioxide ($TiO_2$) particles suspended in silicone. In certain embodiments, the light-altering material comprises a light-absorbing material. In certain embodiments, the LED device is devoid of a submount on the bottom face of the at least one LED chip.

The LED device may further comprise an anode and a cathode on the bottom face of the at least one LED chip. The LED device may further comprise a wavelength conversion element arranged on the top face of the at least one LED chip, the wavelength conversion element comprising at least one lumiphoric material. In certain embodiments, the wavelength conversion element further comprises a superstrate that supports the at least one lumiphoric material. In certain embodiments, the wavelength conversion element comprises one of a ceramic phosphor plate, phosphor-in-glass, or phosphor embedded in silicone. In certain embodiments, peripheral side surfaces of the wavelength conversion element are offset from the peripheral sidewalls of the at least one LED chip. In certain embodiments, the light-altering material is conformal on the peripheral side surfaces of the wavelength conversion element and the peripheral sidewalls of the at least one LED chip. In certain embodiments, the light-altering material forms rounded corners at peripheral edge corners of the wavelength conversion element.

In certain embodiments, the light-altering material forms rounded corners at peripheral sidewall corners of the at least one LED chip. In certain embodiments, the light-altering material forms extensions that extend away from the peripheral sidewalls of the at least one LED chip. In certain embodiments, the LED device may further comprise a lens on the at least one LED chip.

In another aspect, a method comprises: providing at least one LED chip comprising a top face, a bottom face, and peripheral sidewalls that bound the top face and the bottom face; forming a light-altering material on the top face and the peripheral sidewalls of the at least one LED chip; and removing a portion of the light-altering material that is on the top face of the at least one LED chip. In certain embodiments, forming the light-altering material comprises laminating a preformed sheet of the light-altering material on the top face and the peripheral sidewalls. In certain embodiments, the light-altering material forms rounded corners at peripheral sidewall corners of the at least one LED chip.

The method may further comprise providing a wavelength conversion element on the top face of the at least one LED chip before forming the light-altering material. In certain embodiments, removing the portion of the light-altering material that is on the top face of the at least one LED chip comprises removing the portion of the light-altering material that is on a top face of the wavelength conversion element. In certain embodiments, the light-altering material forms rounded corners at peripheral edge corners of the wavelength conversion element. In certain embodiments, the at least one LED chip comprises a plurality of LED chips that are arranged on a common support. In certain embodiments, forming the light-altering material comprises laminating a preformed sheet of the light-altering material on the top face and the peripheral sidewalls of each LED chip of the plurality of LED chips. The method may further comprise separating each LED chip of the plurality of LED chips from the common support.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1A:
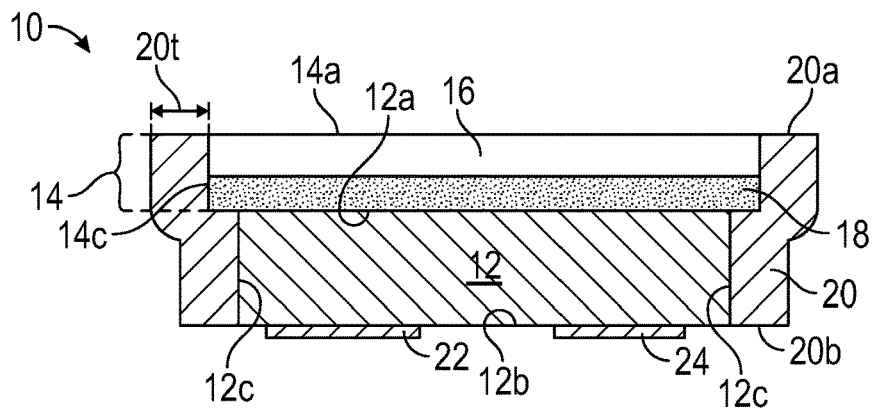
FIG. 1A is a cross-sectional view of a light-emitting diode (LED) device according to aspects disclosed herein.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to solid-state lighting devices, and more particularly to light-altering material arrangements for light-emitting devices such as light-emitting diodes (LEDs). LED devices may include light-altering materials that are provided around peripheral sidewalls of LED chips without the need for a supporting submount or lead frame. The light-altering materials may be provided with reduced thicknesses along peripheral sidewalls of LED chips. In this regard, an exemplary LED device as disclosed herein may be configured with a footprint that is close to a footprint of the LED chip within the LED device while also providing an amount of light-altering material around peripheral edges of the LED chip to reduce cross-talk. Accordingly, such LED devices may be well suited for use in applications where LED devices form closely-spaced LED arrays. Fabrication techniques are disclosed that include laminating a preformed sheet of light-altering material on one or more surfaces of the LED chip.

An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including, but not limited to, buffer layers, nucleation layers, super lattice structures, un-doped layers, cladding layers, contact layers, and current-spreading layers and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen (N) and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), and related compounds.

The active LED structure may be grown on a growth substrate that can include many materials, such as sapphire, SiC, aluminum nitride (AlN), and GaN, with a suitable substrate being a 4H polytype of SiC, although other SiC polytypes can also be used including 3C, 6H, and 15R polytypes. SiC has certain advantages, such as a closer crystal lattice match to Group III nitrides than other substrates and results in Group III nitride films of high quality. SiC also has a very high thermal conductivity so that the total output power of Group III nitride devices on SiC is not limited by the thermal dissipation of the substrate. Sapphire is another common substrate for Group III nitrides and also has certain advantages, including being lower cost, having established manufacturing processes, and having good light-transmissive optical properties.

Different embodiments of the active LED structure can emit different wavelengths of light depending on the composition of the active layer and n-type and p-type layers. In some embodiments, the active LED structure emits blue light with a peak wavelength range of approximately 430 nanometers (nm) to 480 nm. In other embodiments, the active LED structure emits green light with a peak wavelength range of 500 nm to 570 nm. In other embodiments, the active LED structure emits red light with a peak wavelength range of 600 nm to 650 nm.

An LED chip can also be covered with one or more lumiphoric materials (also referred to herein as lumiphors), such as phosphors, such that at least some of the light from the LED chip is absorbed by the one or more lumiphors and is converted to one or more different wavelength spectra according to the characteristic emission from the one or more lumiphors. In this regard, at least one lumiphor receiving at least a portion of the light generated by the LED source may re-emit light having different peak wavelength than the LED source. An LED source and one or more lumiphoric materials may be selected such that their combined output results in light with one or more desired characteristics such as color, color point, intensity, etc. In certain embodiments, aggregate emissions of LED chips, optionally in combination with one or more lumiphoric materials, may be arranged to provide cool white, neutral white, or warm white light, such as within a color temperature range of from 2500 K to 10,000K. In certain embodiments, lumiphoric materials having cyan, green, amber, yellow, orange, and/or red peak wavelengths may be used. In some embodiments, the combination of the LED chip and the one or more lumiphors (e.g., phosphors) emits a generally white combination of light. The one or more phosphors may include yellow (e.g., YAG:Ce), green (e.g., LuAg:Ce), and red (e.g., $Ca_{i-x-y}Sr_xEu_yAlSiN_3$) emitting phosphors, and combinations thereof.

Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips. One or more lumiphoric materials may be provided on one or more portions of an LED chip in various configurations. In certain embodiments, one or more surfaces of LED chips may be conformally coated with one or more lumiphoric materials, while other surfaces of such LED chips may be devoid of lumiphoric material. In certain embodiments, a top surface of an LED chip may include lumiphoric material, while one or more side surfaces of an LED chip may be devoid of lumiphoric material. In certain embodiments, all or substantially all outer surfaces of an LED chip (e.g., other than contact-defining or mounting surfaces) are coated or otherwise covered with one or more lumiphoric materials. In certain embodiments, one or more lumiphoric materials may be arranged on or over one or more surfaces of an LED chip in a substantially uniform manner. In other embodiments, one or more lumiphoric materials may be arranged on or over one or more surfaces of an LED chip in a manner that is non-uniform with respect to one or more of material composition, concentration, and thickness. In certain embodiments, the loading percentage of one or more lumiphoric materials may be varied on or among one or more outer surfaces of an LED chip. In certain embodiments, one or more lumiphoric materials may be patterned on portions of one or more surfaces of an LED chip to include one or more stripes, dots, curves, or polygonal shapes. In certain embodiments, multiple lumiphoric materials may be arranged in different discrete regions or discrete layers on or over an LED chip.

In certain embodiments, one or more lumiphoric materials may be provided as at least a portion of a wavelength conversion element. Wavelength conversion elements may include a support element, such as a superstrate, and one or more lumiphoric materials that are provided by any suitable means, such as by coating a surface of the superstrate or by incorporating within the superstrate. The term "superstrate" as used herein refers to an element placed on or over an LED chip that may include a lumiphoric material. The term "superstrate" is used herein, in part, to avoid confusion with other substrates that may be part of the semiconductor light-emitting device, such as a growth or carrier substrate of the LED chip or a submount of an LED package. The term "superstrate" is not intended to limit the orientation, location, and/or composition of the structure it describes. In some embodiments, the superstrate may be composed of a transparent material, a semi-transparent material, or a light-transmissive material, such as sapphire, SiC, silicone, and/or glass (e.g., borosilicate and/or fused quartz). Superstrates may be patterned to enhance light extraction as described in commonly-assigned U.S. Patent Application Publication No. 2019/0326484 entitled "Semiconductor Light Emitting Devices Including Superstrates With Patterned Surfaces" which is hereby incorporated by reference herein. Superstrates may also be configured as described in commonly-assigned U.S. Patent Application Publication No. 2018/0033924, also incorporated by reference herein. Superstrates may be formed from a bulk substrate which is optionally patterned and then singulated. In certain embodiments, the patterning of a superstrate may be performed by an etching process (e.g., wet or dry etching). In certain embodiments, the patterning of a superstrate may be performed by otherwise altering the surface, such as by a laser or saw. In certain embodiments, the superstrate may be thinned before or after the patterning process is performed. In certain embodiments, superstrates may comprise a generally planar upper surface that corresponds to a light emission area of the LED package.

One or more lumiphoric materials may be arranged on the superstrate by, for example, spraying and/or otherwise coating the superstrate with the lumiphoric materials. Wavelength conversion elements may be attached to one or more LED chips using, for example, a layer of transparent adhesive. In certain embodiments, the layer of the transparent adhesive may include silicone with a refractive index in a range of about 1.3 to about 1.6 that is less than a refractive index of the LED chip on which the wavelength conversion element is placed. In other embodiments, wavelength conversion elements may comprise alternative configurations, such as phosphor-in-glass or ceramic phosphor plate arrangements. Phosphor-in-glass or ceramic phosphor plate arrangements may be formed by mixing phosphor particles with glass frit or ceramic materials, pressing the mixture into planar shapes, and firing or sintering the mixture to form a hardened structure that can be cut or separated into individual wavelength conversion elements.

Light emitted by the active layer or region of an LED chip typically has a lambertian emission pattern. For directional applications, internal mirrors or external reflective surfaces may be employed to redirect as much light as possible toward a desired emission direction. Internal mirrors may include single or multiple layers. Some multi-layer mirrors include a metal reflective layer and a dielectric reflective layer, wherein the dielectric reflective layer is arranged between the metal reflective layer and a plurality of semiconductor layers. A passivation layer is arranged between the metal reflective layer and first and second electrical contacts, wherein the first electrical contact is arranged in conductive electrical communication with a first semiconductor layer, and the second electrical contact is arranged in conductive electrical communication with a second semiconductor layer. For single or multi-layer mirrors including surfaces exhibiting less than 100% reflectivity, some light may be absorbed by the mirror. Additionally, light that is redirected through the active LED structure may be absorbed by other layers or elements within the LED chip.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In some embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (Ag) may be considered a reflective material (e.g., at least 80% reflective). In the case of ultraviolet (UV) LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength.

The present disclosure can be useful for LED chips having a variety of geometries, such as vertical geometry or lateral geometry. In certain embodiments, a vertical geometry or lateral geometry LED chip may be configured as set forth in the commonly-assigned U.S. Pat. No. 9,461,201, which is hereby incorporated by reference herein. A vertical geometry LED chip typically includes anode and cathode connections on opposing sides or faces of the LED chip. A lateral geometry LED chip typically includes both anode and cathode connections on the same side of the LED chip that is opposite a substrate, such as a growth substrate. In some embodiments, a lateral geometry LED chip may be mounted on a submount of an LED package such that the anode and cathode connections are on a face of the LED chip that is opposite the submount. In this configuration, wirebonds may be used to provide electrical connections with the anode and cathode connections. In other embodiments, a lateral geometry LED chip may be flip-chip mounted on a surface of a submount of an LED package such that the anode and cathode connections are on a face of the active LED structure that is adjacent to the submount. In this configuration, electrical traces or patterns may be provided on the submount for providing electrical connections to the anode and cathode connections of the LED chip. In a flip-chip configuration, the active LED structure is configured between the substrate of the LED chip and the submount for the LED package. Accordingly, light emitted from the active LED structure may pass through the substrate in a desired emission direction. In certain embodiments, the flip-chip LED chip may be configured as described in commonly-assigned U.S. Patent Application Publication No. 2017/0098746, which is hereby incorporated by reference herein. In other embodiments, an active LED structure may be bonded to a carrier submount, and the growth substrate may be removed such that light may exit the active LED structure without passing through the growth substrate. In certain embodiments, an LED package may be configured as set forth in the following commonly-assigned U.S. patents and U.S. publications, which are hereby incorporated by reference herein: U.S. Pat. Nos. 8,866,169; 9,070,850; 9,887,327; and 10,468,565.

Aspects as disclosed herein may be useful for LED modules, systems or fixtures that include closely-spaced LED emitters or devices that are capable of providing overall combined emissions as well as a number of changeable, selectable, or tunable emission characteristics that are provided by separately controlling the LED devices. In this manner, LED devices are arranged as close to one another as possible so they may appear as a single emission area when all are electrically activated, and when different emissions characteristics are desired, certain ones or groups of closely-spaced LED devices may be separately electrically activated or deactivated. In such applications, size and spacing limitations can make it impractical to use separately packaged LEDs. Conventional LED packages typically include an LED chip that is mounted on a larger submount and an encapsulant that encloses the LED chip on the submount, thereby providing the LED package with an increased footprint relative to the LED chip. Additionally, conventional LED packages may also include multiple LED chips that are arranged on a common substrate (e.g., a ceramic panel) or a leadframe package. However, this also contributes to an increased package footprint in order to accommodate the common substrate or leadframe. This increased footprint can be undesirable for manufacturers that want to build pixelated lighting systems, such as those used for adaptive automotive headlights or display applications.

According to aspects disclosed herein, LED devices are provided with reduced footprints that allow for the assembly of arrays of closely-spaced LED devices on common supports, such as printed circuit boards (PCBs). LED devices as disclosed herein may be fabricated to be devoid of conventional submounts and leadframes that contribute to increased footprints. In certain aspects, an LED device that is capable of being attached to external electrical connections, such as those provided on a PCB, without the use of a conventional submount and leadframe may be referred to as a chip scale package (CSP). In this regard, a CSP may include one or more elements, such as lumiphoric materials, encapsulants, light-altering materials, lens, and electrical contacts, among others, that are provided with one or more LED chips without a conventional submount or leadframe. For closely-spaced applications, the LED devices (e.g., CSPs) may also be configured to avoid interaction or cross-talk that may be caused by emissions that bleed over from adjacent LED devices. In this regard, LED devices as disclosed herein may be configured with a footprint that is close to a footprint of the LED chip within the LED device while also providing an amount of light-altering material around peripheral edges of the LED chip to reduce cross-talk.

As used herein, light-altering materials may include many different materials including light-reflective materials that reflect or redirect light, light-absorbing materials that absorb light, and materials that act as a thixotropic agent. As used herein, the term "light-reflective" refers to materials or particles that reflect, refract, or otherwise redirect light. For light-reflective materials, the light-altering material may include at least one of fused silica, fumed silica, titanium dioxide ($TiO_2$), or metal particles suspended in a binder, such as silicone or epoxy. For light-absorbing materials, the light-altering material may include at least one of carbon, silicon, or metal particles suspended in a binder, such as silicone or epoxy. The light-reflective materials and the light-absorbing materials may comprise nanoparticles. In certain embodiments, the light-altering material may comprise a generally white color to reflect and redirect light. In other embodiments, the light-altering material may comprise a generally opaque or black color for absorbing light and increasing contrast.

In certain embodiments, the light-altering material includes both light-reflective material and light-absorbing material suspended in a binder. A weight ratio of the light-reflective material to the binder may comprise a range of about 1:1 to about 2:1. A weight ratio of the light-absorbing material to the binder may comprise a range of about 1:400 to about 1:10. In certain embodiments, a total weight of the light-altering material includes any combination of the binder, the light-reflective material, and the light-absorbing material. In some embodiments, the binder may comprise a weight percent that is in a range of about 10% to about 90% of the total weight of the light-altering material. The light-reflective material may comprise a weight percent that is in a range of about 10% to about 90% of the total weight of the light-altering material. The light-absorbing material may comprise a weight percent that is in a range of about 0% to about 15% of the total weight of the light-altering material.

In further embodiments, the light-absorbing material may comprise a weight percent that is in a range of about greater than 0% to about 15% of the total weight of the light-altering material. In further embodiments, the binder may comprise a weight percent that is in a range of about 25% to about 70% of the total weight of the light-altering material. The light-reflective material may comprise a weight percent that is in a range of about 25% to about 70% of the total weight of the light-altering material. The light-absorbing material may comprise a weight percent that is in a range of about 0% to about 5% of the total weight of the light-altering material. In further embodiments, the light-absorbing material may comprise a weight percent that is in a range of about greater than 0% to about 5% of the total weight of the light-altering material.

In certain aspects, light-altering materials may be provided in a preformed sheet or layer that includes light-altering particles suspended in a binder. For example, light-altering particles may be suspended in a binder of silicone that is not fully cured to provide the preformed sheet of light-altering materials. A desired thickness or height of the preformed sheet may be provided by moving a doctor blade or the like across the sheet. The preformed sheet may then be positioned on and subsequently formed around an LED chip and/or a wavelength conversion element that is on the LED chip. For example the preformed sheet may be laminated around the LED chip and/or wavelength conversion element and then the performed sheet may be fully cured in place. One or more portions of the preformed sheet may then be removed from a primary light-emitting face of the LED chip and/or wavelength conversion element. In this manner, light-altering materials may be formed along peripheral edges or sidewalls of the LED chip and wavelength conversion element with thicknesses not previously possible with conventional dispensing techniques typically used to form light-altering materials. Additionally, light-altering materials may be provided without needing conventional submounts or lead frames as support for conventional dispensing and/or molding techniques. In this regard, LED devices with light-altering materials may be provided with reduced footprints suitable for closely-spaced LED arrangements.

In certain applications, LED devices as disclosed herein may be well suited in closely-spaced array applications such automotive lighting, general lighting, and lighting displays. For exterior automotive lighting, multiple LED devices may be arranged under a common lens or optic to provide a single overall emission or emissions that are capable of changing between different emission characteristics. Changing emission characteristics may include toggling between high beam and low beam emissions, adaptively changing emissions, and adjusting correlated color temperatures (CCTs) that correspond with day time and night time running conditions. In general lighting applications, LED devices as disclosed herein may be configured to provide modules, systems, and fixtures that are capable of providing one or more different emission colors or CCT values, such as one or more of warm white (e.g., 2700 Kelvin (K)-3000 K), neutral white (e.g., 3500-4500 K), and cool white (5000-6500 K). For horticulture lighting applications, LED devices as disclosed herein may be arranged to provide modules, systems, and fixtures that are capable of changing between different emission characteristics that target various growth conditions of different crops.

FIG. 1A is a cross-sectional view of an LED device 10 according to aspects disclosed herein. The LED device 10 includes an LED chip 12 and the LED device 10 is devoid of a submount and/or lead frame typically found in conventional LED packages. In this regard, the LED device 10 may be referred to as a CSP. While FIG. 1A illustrates a single LED chip 12, the LED device 10 may include a plurality of LED chips 12 without deviating from the principles disclosed herein. The LED chip 12 may include a top face 12a, a bottom face 12b, and peripheral sidewalls 12c that bound the top face 12a and the bottom face 12b. By way of example, for a square or rectangular area of the top face 12a and the bottom face 12b, the LED chip 12 may comprise four peripheral sidewalls 12c. In certain embodiments, the LED device 10 may comprise a wavelength conversion element 14 that includes a superstrate 16 and a lumiphoric material 18 disposed thereon. The superstrate 16 may comprise a material that is light-transmissive and/or transparent to light emitted by the LED chip and light that is converted by the lumiphoric material 18. The superstrate 16 may also be textured to improve light extraction or contain materials such as phosphors or scattering particles. The lumiphoric material 18 may comprise any of the materials as previously described, including one or more phosphors that provide the same or different emission characteristics. In certain embodiments, the superstrate 16 and the lumiphoric material 18 may be attached to the LED chip 12 using, for example, a layer of transparent adhesive such as silicone. In certain embodiments, the lumiphoric material 18 is formed between the superstrate 16 and the LED chip 12, thereby protecting the lumiphoric material 18 from environmental exposure.

As further illustrated in FIG. 1A, a light-altering material 20 is provided around the peripheral sidewalls 12c of the LED chip 12. The light-altering material 20 may also be provided around peripheral side surfaces 14c of the wavelength conversion element 14. As described above and will be described in greater detail below, the light-altering material 20 may be formed by a lamination process that provides a reduced thickness 20t as measured laterally from either the peripheral sidewalls 12c of the LED chip 12 or peripheral side surfaces 14c of the wavelength conversion element 14. In certain embodiments, the thickness 20t of the light-altering material 20 is in a range including 15 microns (μm) and 100 μm, or in a range including 15 μm and 60 μm, or in a range including 15 μm and 50 μm, or in a range including 20 μm and 50 μm. Such thickness 20t ranges may be configured differently for different dimensions of the LED chip 12. For example, a height of the LED chip 12 as measured from the top face 12a to the bottom face 12b may be in a range including 100 μm and 150 μm in a particular embodiment. In this regard, the light-altering material 20 may be configured with a thickness 20t that is in a range including 40 μm and 60 μm. Due to the fabrication process described below, higher thickness 20t values for the light-altering material 20 that are too close to the height of the LED chip 12 may impair the light-altering material 20 from suitably conforming around the LED chip 12. Additionally, such thickness 20t ranges may be configured differently depending on a desired spacing of the LED device 10 with other LED devices, with lower thickness 20t values corresponding to lower achievable spacing. In certain embodiments, the thickness 20t is provided around all peripheral sidewalls 12c of the LED chip 12 and/or all peripheral side surfaces 14c of the wavelength conversion element 14, thereby providing the LED device with an overall footprint that is only nominally larger that the LED chip 12 itself.

As illustrated in FIG. 1A, the light-altering material 20 may be formed in such a manner that the light-altering material 20 is conformal to the peripheral sidewalls 12c of the LED chip 12 and peripheral side surfaces 14c of the wavelength conversion element 14. In this regard, the thickness 20t of the light-altering material 20 may be the same for both the peripheral sidewalls 12c of the LED chip 12 and peripheral side surfaces 14c of the wavelength conversion element 14 with a curved transition therebetween. Additionally, a top surface 20a of the light-altering material 20 may be arranged to be coplanar or substantially coplanar with a top face 14a of the wavelength conversion element 14. In this manner, the top face 14a of the wavelength conversion element 14 forms a primary light-emitting face of the LED device 10. The LED device 10 may further include a cathode contact 22 and an anode contact 24 that are provided on the bottom face 12b of the LED chip 12 in a flip-chip arrangement. A bottom surface 20b of the light-altering material 20 may be coplanar with the bottom face 12b of the LED chip 12, or coplanar with bottom surfaces of the cathode contact 22 and the anode contact 24. As illustrated, the LED device 10 is devoid of a conventional submount or lead frame, while still including the light-altering material 20 and the wavelength conversion element 14. With this arrangement, the cathode contact 22 and the anode contact 24 may be configured for direct mounting with external electrical connections, such as electrical traces of a PCB.

Figure 1B:
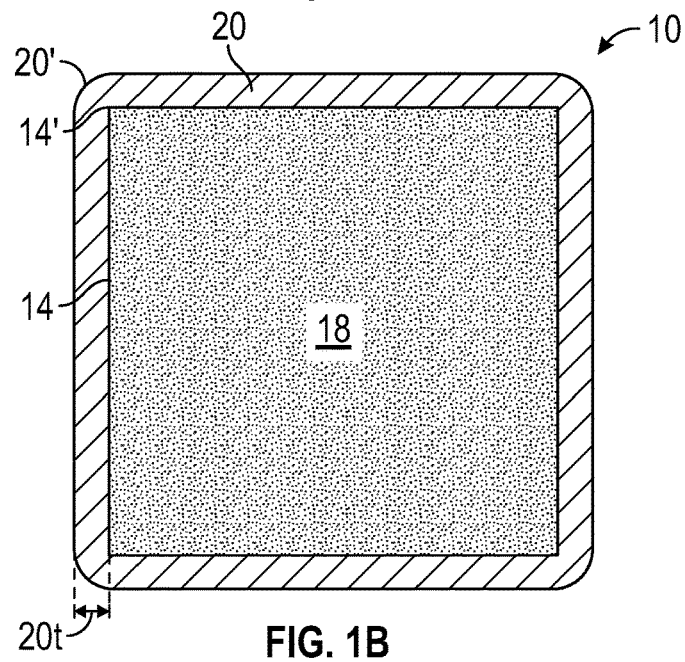
FIG. 1B is a top view of the LED device of FIG. 1A.

FIG. 1B is a top view of the LED device 10 of FIG. 1A. As illustrated, the light-altering material 20 is arranged around a perimeter of the wavelength conversion element 14. From the top view, the lumiphoric material 18 may be visible through the superstrate (16 of FIG. 1A). Notably, the light-altering material 20 forms with the reduced thickness 20t and rounded corners 20' registered with peripheral edge corners 14' of the wavelength conversion element 14 due to the nature of a lamination process. In contrast, lines of light-altering materials of conventional LED packages are typically dispensed on a common submount between LED chips before a saw blade divides the common submount along the light-altering material lines, thereby forming thicker light-altering materials with squared corners formed by sawing.

Figure 1C:
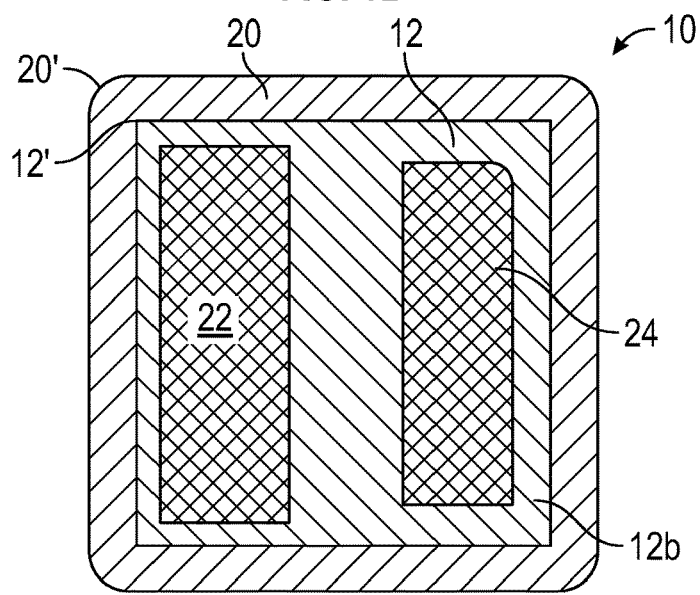
FIG. 1C is a bottom view of the LED device of FIG. 1A.

FIG. 1C is a bottom view of the LED device 10 of FIG. 1A. As illustrated, the light-altering material 20 is arranged around a perimeter of the LED chip 12 with the rounded corners 20' that are registered with peripheral sidewall corners 12' of the LED chip 12. From the bottom view, the cathode contact 22 and the anode contact 24 are accessible from the bottom face 12b of the LED chip 12 and configured for providing an external electrical connection. In certain embodiments, the bottom face 12b of the LED chip 12 is devoid of the light-altering material 20. In contrast, conventional dispensed light-altering materials may have a tendency to wick along the bottom face 12b, which may contribute to de-bonding failures after mounting.

Figure 2A:
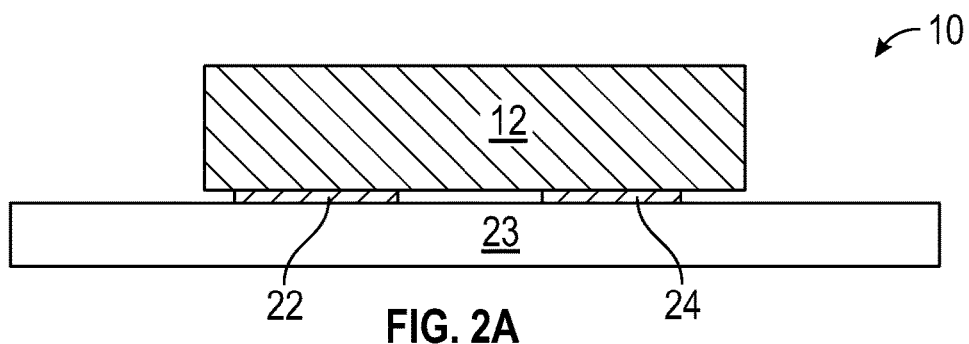
FIG. 2A is a cross-sectional view of the LED device of FIG. 1A at a fabrication step where an LED chip is attached to a temporary carrier.
Figure 2B:
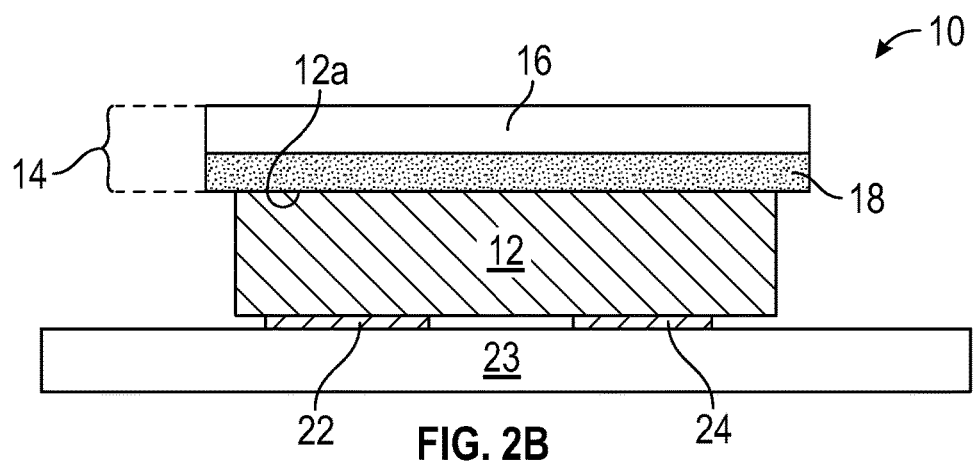
FIG. 2B is a cross-sectional view of the LED device of FIG. 1A at a fabrication step where a wavelength conversion element is attached to a top face of the LED chip.

FIGS. 2A-2G are cross-sectional views of the LED device 10 of FIG. 1A at sequential fabrication steps. For illustrative purposes, FIGS. 2A-2G show a single LED device 10, however it is understood that in practice, a plurality of LED devices 10 may be formed at the same time according to FIGS. 2A-2G. In FIG. 2A, the LED chip 12 is attached to a temporary carrier 23 such that the cathode contact 22 and the anode contact 24 are arranged between the LED chip 12 and the temporary carrier 23. In certain embodiments, the temporary carrier 23 comprises a flexible tape on which a plurality of LED chips 12 may be provided. In FIG. 2B, the wavelength conversion element 14 is attached to the top face 12a of the LED chip 12. As illustrated, the wavelength conversion element 14 may include lateral dimensions that are greater than lateral dimensions of the LED chip 12, thereby increasing alignment tolerances.

Figure 2C:
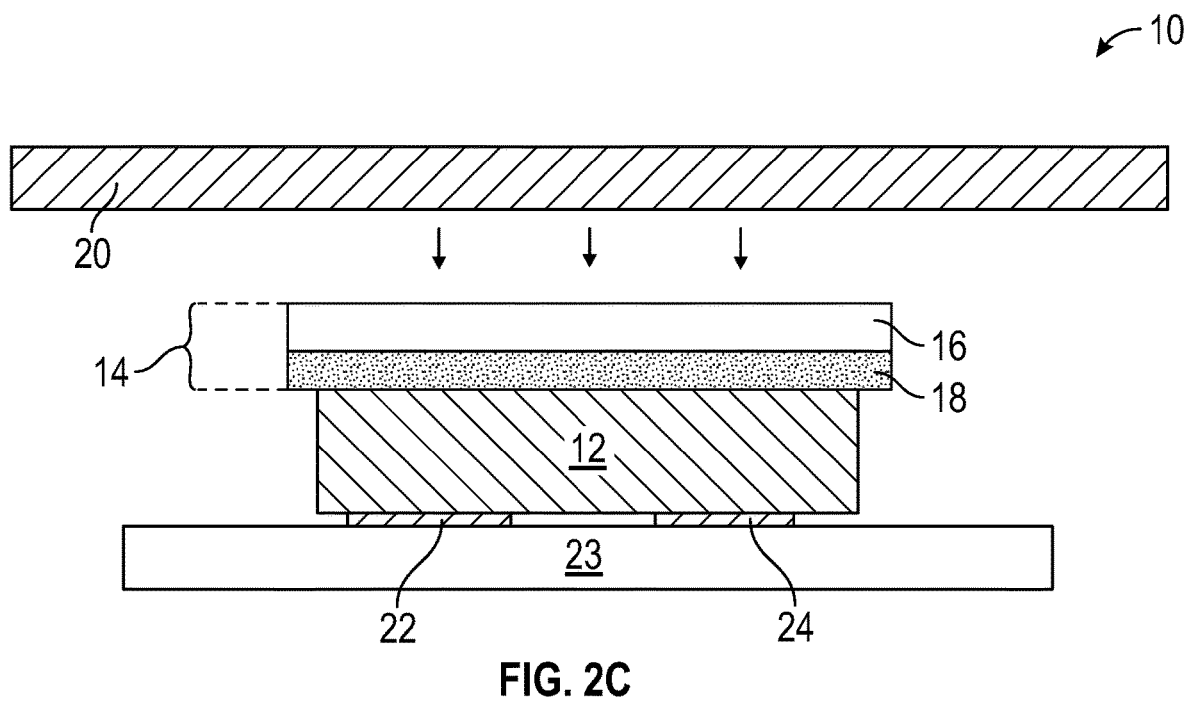
FIG. 2C is a cross-sectional view of the LED device of FIG. 1A at a fabrication step where a preformed sheet of light-altering material is provided above the LED chip.
Figure 2D:
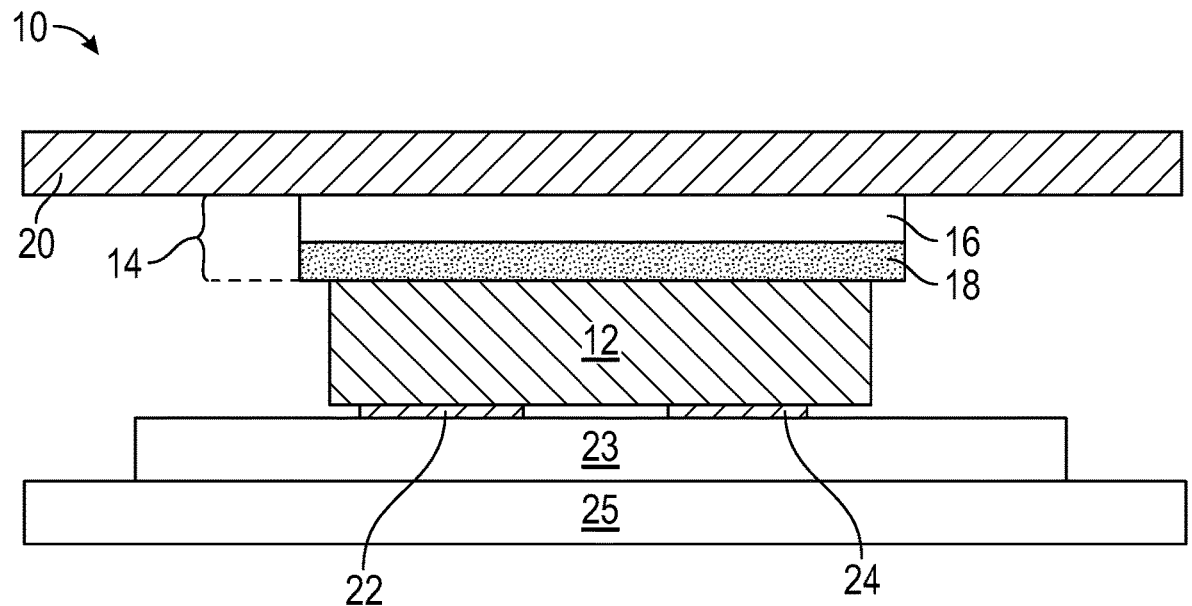
FIG. 2D is a cross-sectional view of the LED device of FIG. 1A at a fabrication step where the preformed sheet of light-altering material is positioned on the LED chip and the wavelength conversion element.
Figure 2E:
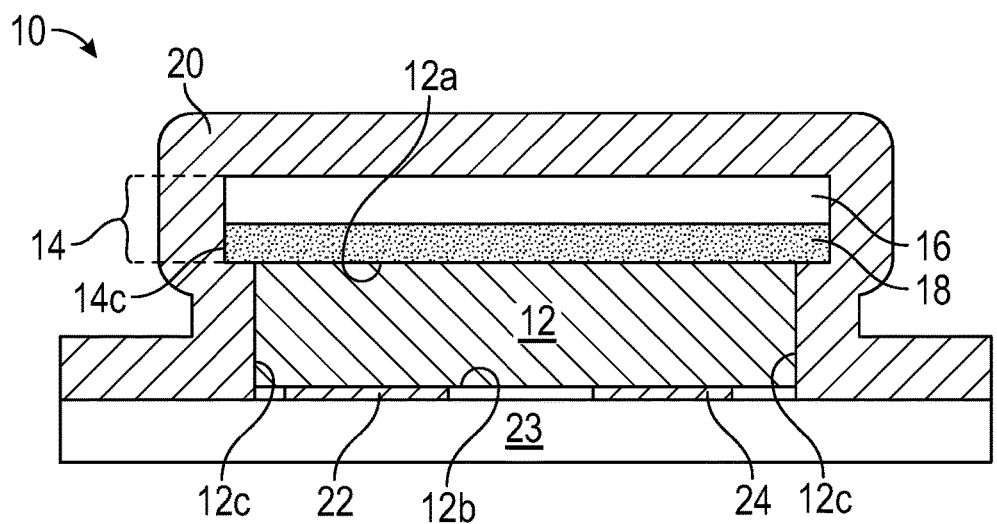
FIG. 2E is a cross-sectional view of the LED device of FIG. 1A at a fabrication step where the light-altering material is laminated in a conformal manner around peripheral side surfaces of the wavelength conversion element and around peripheral sidewalls of the LED chip.

In FIG. 2C, a preformed sheet of the light-altering material 20 is provided above the LED chip 12. In FIG. 2D, the preformed sheet of the light-altering material 20 is positioned on the LED chip 12 and the wavelength conversion element 14. As previously described, the preformed sheet of the light-altering material 20 may comprise light-altering particles or materials that are provided in a partially cured binder, such as partially cured silicone. In this regard, the preformed sheet of the light-altering material 20 is unitary and flexible for conforming to the LED chip 12 and the wavelength conversion element 14. After positioning of the preformed sheet, the LED device 10 may be provided in a chamber at a vacuum pressure that is lower than atmospheric pressure and lowered onto a heat source 25 such as a hot plate to promote lamination of the light-altering material 20. In FIG. 2E, the light-altering material 20 is laminated in a conformal manner around the peripheral side surfaces 14c of the wavelength conversion element 14 and around the peripheral sidewalls 12c of the LED chip 12. In certain embodiments, the arrangement of the cathode contact 22 and the anode contact 24 on the temporary carrier 23 may prevent the light-altering material 20 from forming on the bottom face 12b of the LED chip 12. In this regard, portions of the light-altering material 20 may extend laterally on the temporary carrier 23. When multiple LED devices 10 are formed at the same time on the temporary carrier 23, the light-altering material 20 may be laminated in a continuous manner across all of the multiple LED devices 10. As illustrated, the light-altering material 20 is also formed on or over the top face 12a of the LED chip 12. After the lamination process, the LED device 10 may be placed in an oven or the like for fully curing the light-altering material 20 in place.

Figure 2F:
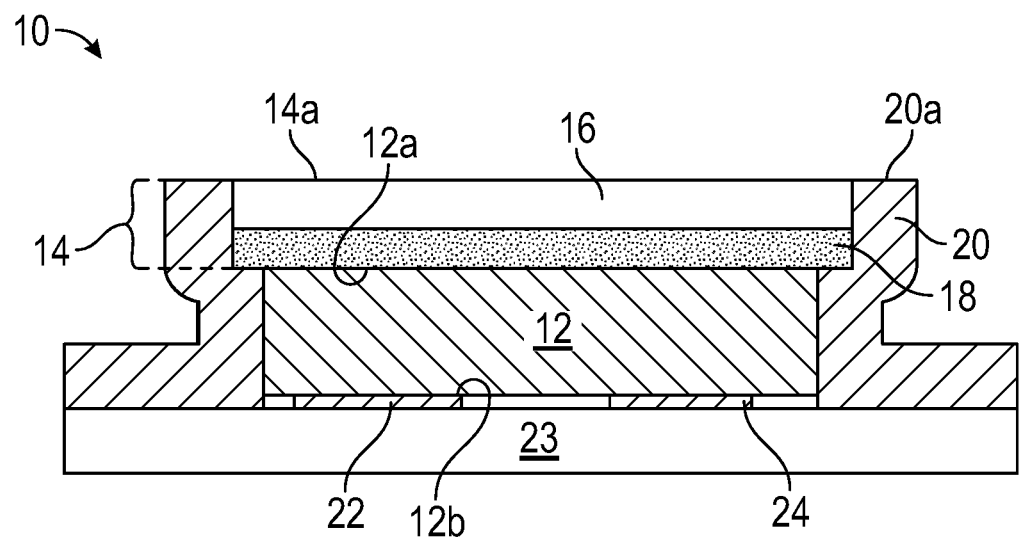
FIG. 2F is a cross-sectional view of the LED device of FIG. 1A at a fabrication step where a portion of the light-altering material that is on the on a top face of the LED chip and on a top face of the wavelength conversion element is removed.
Figure 2G:
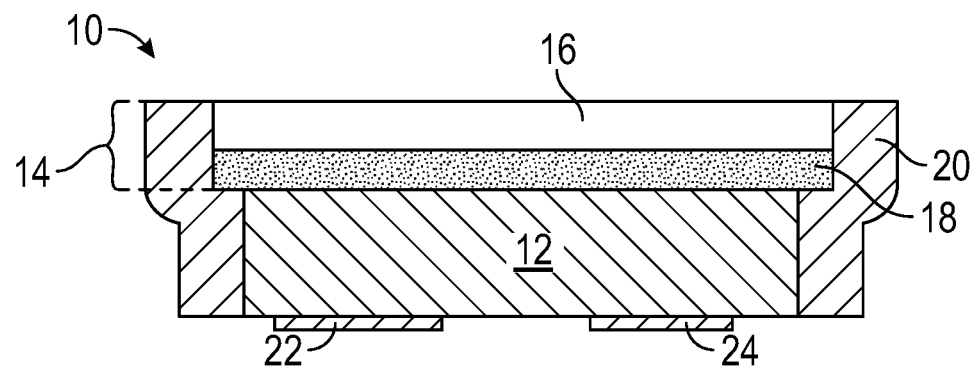
FIG. 2G is a cross-sectional view of the LED device of FIG. 1A at a fabrication step where the LED device is separated from the temporary carrier.

In FIG. 2F, a portion of the light-altering material 20 that is on the on the top face 12a of the LED chip 12 and on the top face 14a of the wavelength conversion element 14 is removed to allow light emissions in a desired direction for the LED device 10. In certain embodiments, a polishing process may be used such that the top surface 20a of the light-altering material 20 is coplanar with the top face 14a of the wavelength conversion element 14. In other embodiments, etching or bead blasting processes may be used. As illustrated in FIG. 2G, the LED device 10 is removed or singulated from the temporary carrier 23 such that the light-altering material 20 is provided in a manner as described above for FIG. 1A. In certain embodiments, a sawing process may be applied to the temporary carrier 23 to singulate the LED device 10 and separate portions of the light-altering material 20 from other LED devices that may have been provided nearby on the temporary carrier 23. As illustrated, all surfaces of the lumiphoric material 18 may be covered by the superstrate 16 and the light-altering material 20, thereby reducing environmental exposure of the lumiphoric material 18, and accordingly reducing corresponding degradation of the lumiphoric material 18.

According to aspects disclosed herein, LED devices of various combinations may be arranged with light-altering materials around peripheral sidewalls of LED chips as described above. Different configurations of wavelength conversion elements may be provided. In various embodiments, LED devices may also be provided with lenses of various shapes, including hemispherical or dome-shaped, ellipsoid bullet, flat, hex-shaped, cubic and square. In certain embodiments, a suitable lens shape includes both curved and planar surfaces, such as a hemispheric top portion with planar side surfaces. A lens may also be textured to improve light extraction or contain materials such as phosphors or scattering particles. FIGS. 3-22, as further described below, include various configurations of LED devices with light-altering materials provided and formed according the embodiments described above for FIGS. 1-2G.

Figure 3:
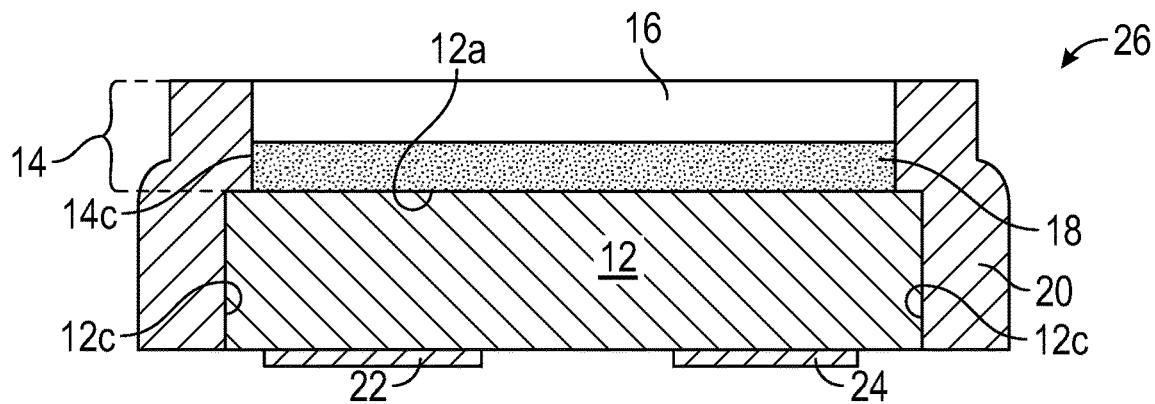
FIG. 3 is a cross-sectional view of an LED device that is similar to the LED device of FIG. 1A, but where the wavelength conversion element is configured with lateral dimensions that are smaller than the LED chip.

FIG. 3 is a cross-sectional view of an LED device 26 that is similar to the LED device 10 of FIG. 1A, but where the wavelength conversion element 14 is configured with lateral dimensions that are smaller than the LED chip 12. In this regard, the light-altering material 20 may be conformal on the peripheral sidewalls 12c of the LED chip and the peripheral side surfaces 14c of the wavelength conversion element 14. By arranging the wavelength conversion element 14 with smaller later dimensions than the LED chip 12, a portion of the light-altering material 20 may be arranged on the top face 12a of the LED chip 12, thereby providing a smaller light-emitting surface for the LED device 26 that may be useful for applications where narrower emissions are desired.

Figure 4:
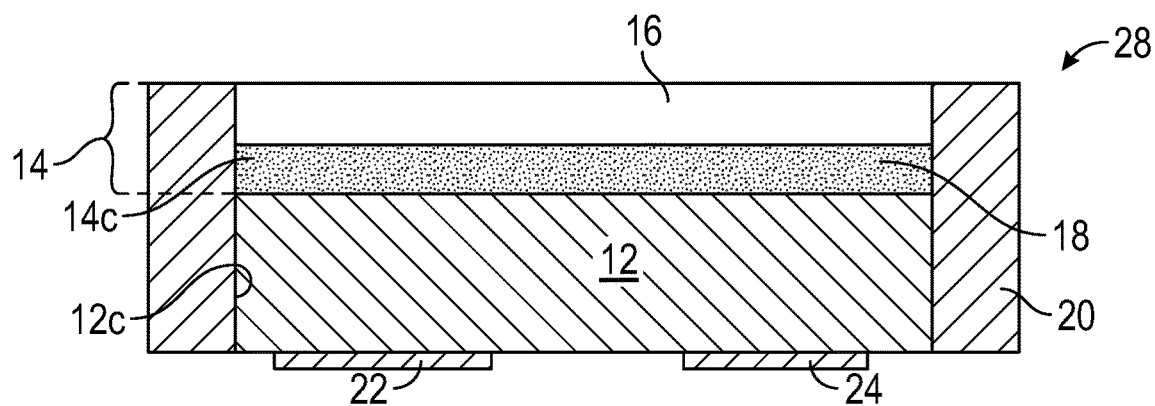
FIG. 4 is a cross-sectional view of an LED device that is similar to the LED device of FIG. 1A, but where the wavelength conversion element is configured with same lateral dimensions as the LED chip.

FIG. 4 is a cross-sectional view of an LED device 28 that is similar to the LED device 10 of FIG. 1A, but where the wavelength conversion element 14 is configured with same lateral dimensions as the LED chip 12. In this regard, the light-altering material 20 may be conformal on the peripheral sidewalls 12c of the LED chip 12 and the peripheral side surfaces 14c of the wavelength conversion element 14 without curved surfaces or contours that would otherwise form if the peripheral sidewalls 12c of the LED chip were offset with the peripheral side surfaces 14c of the wavelength conversion element 14. In this manner, the LED device 28 may be positioned directly adjacent another similarly configured LED device with reduced gaps therebetween.

Figure 5:
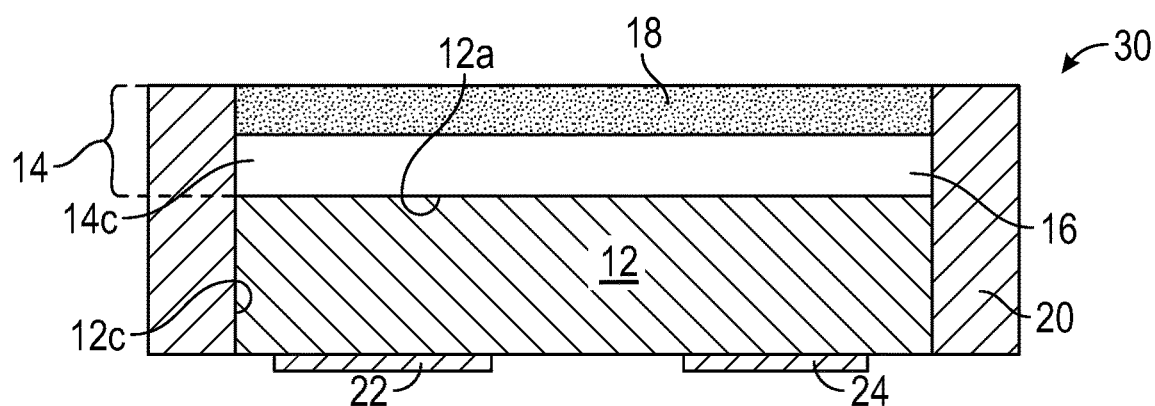
FIG. 5 is a cross-sectional view of an LED device that is similar to the LED device of FIG. 4, but where the order of a lumiphoric material and a superstrate of the wavelength conversion element are reversed.

FIG. 5 is a cross-sectional view of an LED device 30 that is similar to the LED device 28 of FIG. 4, but where the position of the lumiphoric material 18 and the superstrate 16 of the wavelength conversion element 14 are reversed. In this regard, the superstrate 16 is arranged on the top face 12a of the LED chip 12 such that the superstrate 16 is arranged between the lumiphoric material 18 and the LED chip 12. Such an arrangement provides separation of the lumiphoric material 18 from the LED chip 12 that may reduce heating of the lumiphoric material 18 while the LED chip 12 is electrically activated. By having the lumiphoric material 18 that is not entirely covered by the superstrate 16 and the light-altering material 20, the LED device may be suited for applications with reduced environmental exposure or applications where additional housings or encapsulants are arranged to reduce exposure between a surrounding environment and the lumiphoric material 18.

Figure 6:
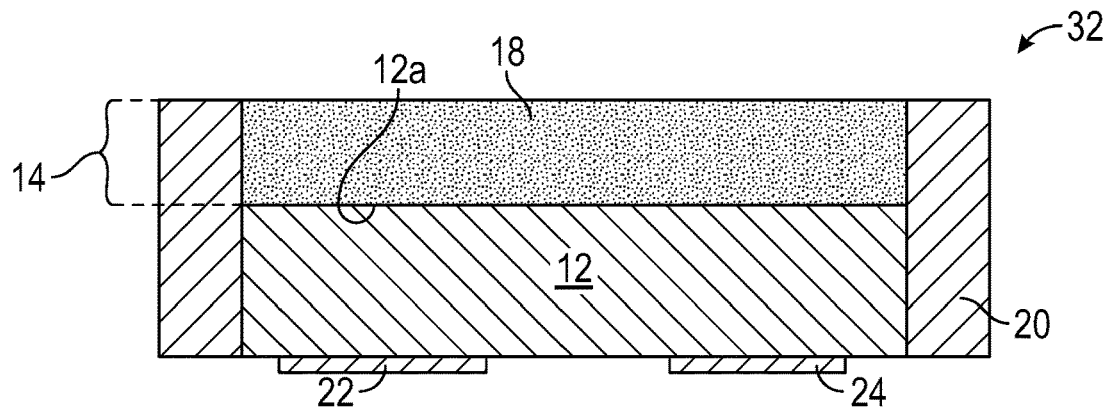
FIG. 6 is a cross-sectional view of an LED device that is similar to the LED device of FIG. 5, but where the lumiphoric material is provided throughout the wavelength conversion element.

FIG. 6 is a cross-sectional view of an LED device 32 that is similar to the LED device 30 of FIG. 5, but where the lumiphoric material 18 is provided throughout the wavelength conversion element 14. In this regard, the lumiphoric material 18 may be embedded within the superstrate (16 of FIG. 5). The wavelength conversion element 14 may comprise one or more of a ceramic phosphor plate, phosphor-in-glass, and phosphor embedded in a layer of silicone. As previously described, phosphor-in-glass or ceramic phosphor plate arrangements may be formed by mixing phosphor particles with glass frit or ceramic materials, pressing the mixture into planar shapes, and firing or sintering the mixture to form a hardened structure that can be cut or separated into individual wavelength conversion elements 14. The light-altering material 20 may be formed around such wavelength conversion elements 14 as previously described.

Figure 7:
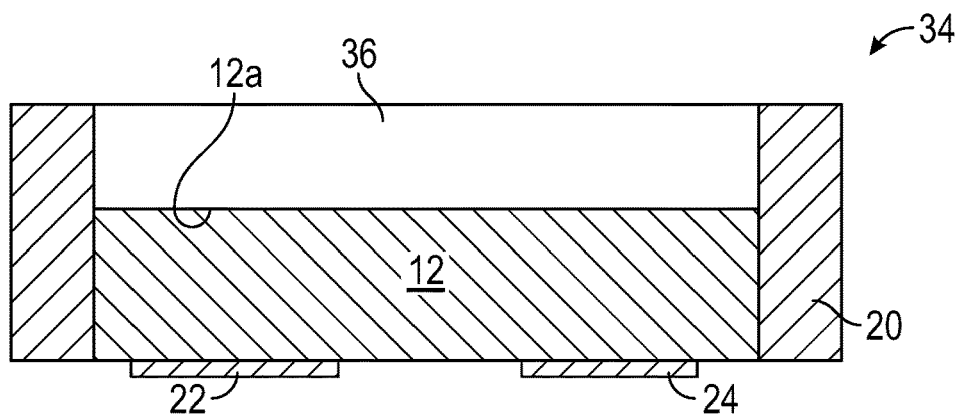
FIG. 7 is a cross-sectional view of an LED device that is similar to the LED device of FIG. 5, but where the LED device is devoid of a lumiphoric material.

FIG. 7 is a cross-sectional view of an LED device 34 that is similar to the LED device 30 of FIG. 5, but where the LED device 34 is devoid of the lumiphoric material 18. In this regard, a lens 36 may be provided over the LED chip 12 that does not convert wavelengths of light generated by the LED chip 12. The lens 36 may comprise a light-transmissive and/or light-transparent material that is similar to the superstrate as previously described. In other embodiments, the lens 36 may comprise silicone and/or glass. As illustrated, the lens 36 forms a flat lens above the LED chip 12. The lens 36 may also be textured to improve light extraction or contain materials such as phosphors or scattering particles. The light-altering material 20 may be formed around the lens 36 in a similar manner as previously described for forming the light-altering material 20 around the wavelength conversion element (14 of FIG. 5). In this regard, the LED device 34 may be configured for single color or monochromatic light emissions.

Figure 8:
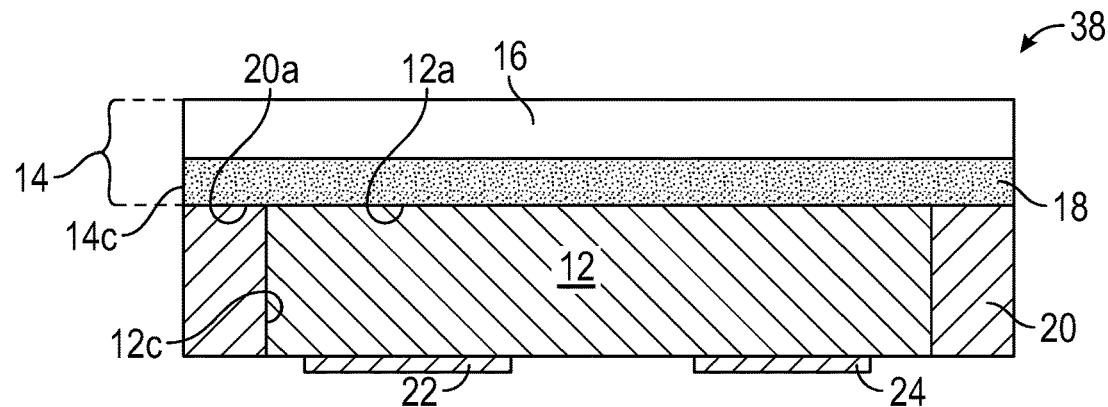
FIG. 8 is a cross-sectional view of an LED device that is similar to the LED device of FIG. 4, but where the light-altering material is not provided around peripheral side surfaces of the wavelength conversion element.

FIG. 8 is a cross-sectional view of an LED device 38 that is similar to the LED device 28 of FIG. 4, but where the light-altering material 20 is not provided around peripheral side surfaces 14c of the wavelength conversion element 14. In this regard, the wavelength conversion element 14 may be arranged on the LED chip 12 after the light-altering material 20 is formed around the peripheral sidewalls 12c of the LED chip 12. As illustrated, the lumiphoric material 18 may be arranged on the top surface 20a of the light-altering material 20. In such an arrangement, portions of the light-altering material 20 that are temporarily formed on the top face 12a of the LED chip 12 may be removed before the wavelength conversion element 14 is placed. In certain embodiments, the top surface 20a of the light-altering material 20 is coplanar with the top face 12a of the LED chip 12. As illustrated, the wavelength conversion element 14 may be arranged on the entire top surface 20a of the light-altering material 20 in certain embodiments. In other embodiments, the wavelength conversion element 14 may be partially arranged on the top surface 20a of the light-altering material 20. As configured, the LED device 38 may be arranged so that light emissions generated by the LED chip 12 may be directed to the wavelength conversion element 14 by the light-altering material 20. Since the peripheral side surfaces 14c of the wavelength conversion element 14 are not surrounded by the light-altering material 20, overall emissions from the LED device 38 may have a wider far field emission pattern.

Figure 9:
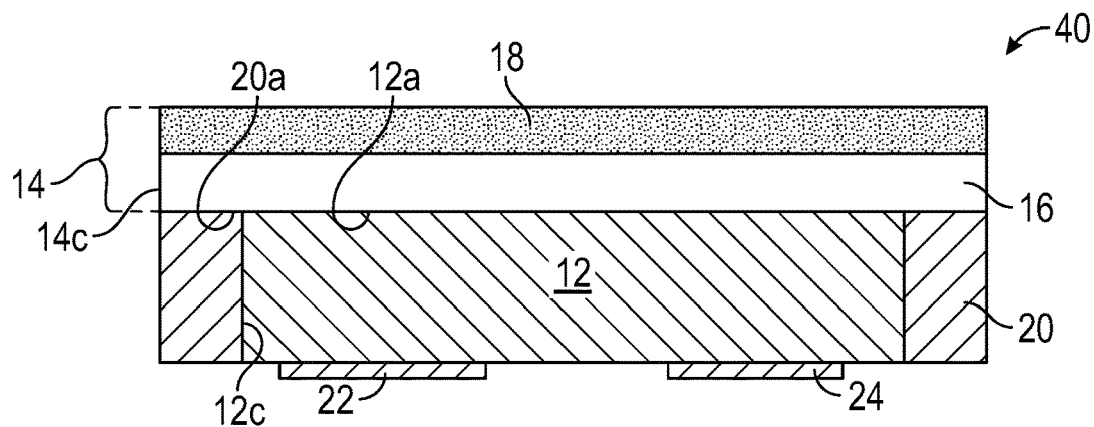
FIG. 9 is a cross-sectional view of an LED device that is similar to the LED device of FIG. 8, but where the order of the lumiphoric material and the superstrate of the wavelength conversion element are reversed.

FIG. 9 is a cross-sectional view of an LED device 40 that is similar to the LED device 38 of FIG. 8, but where the order of the lumiphoric material 18 and the superstrate 16 of the wavelength conversion element 14 are reversed. In this regard, the superstrate 16 is arranged on the top face 12a of the LED chip 12 such that the superstrate 16 is arranged between the lumiphoric material 18 and the LED chip 12. As previously described for the LED device 30 of FIG. 5, such an arrangement provides separation of the lumiphoric material 18 from the LED chip 12 that may reduce heating of the lumiphoric material 18 while the LED chip 12 is electrically activated. As illustrated in FIG. 9, the superstrate 16 is arranged on the top surface 20a of the light-altering material 20.

Figure 10:
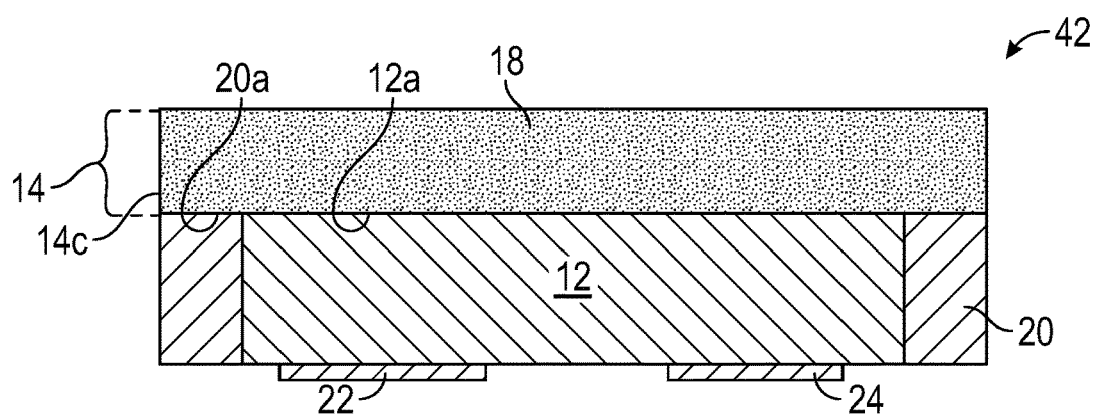
FIG. 10 is a cross-sectional view of an LED device that is similar to the LED device of FIG. 6, but where the wavelength conversion element is also on the top surface of the light-altering material.

FIG. 10 is a cross-sectional view of an LED device 42 that is similar to the LED device 32 of FIG. 6, but where the wavelength conversion element 14 is also on the top surface 20a of the light-altering material 20. In this regard, the lumiphoric material 18 may be embedded within the superstrate (16 of FIG. 5). The wavelength conversion element 14 may comprise one or more of a ceramic phosphor plate, phosphor-in-glass, and phosphor embedded in a layer of silicone. As previously described, phosphor-in-glass or ceramic phosphor plate arrangements may be formed by mixing phosphor particles with glass frit or ceramic materials, pressing the mixture into planar shapes, and firing or sintering the mixture to form a hardened structure that can be cut or separated into individual wavelength conversion elements 14. Since the peripheral side surfaces 14c of the wavelength conversion element 14 are not surround by the light-altering material 20, overall emissions from the LED device 42 may have a wider far field emission pattern. As illustrated, the wavelength conversion element 14 may be arranged on the entire top surface 20a of the light-altering material 20 in certain embodiments. In other embodiments, the wavelength conversion element 14 may be partially arranged on the top surface 20a of the light-altering material 20.

Figure 11:
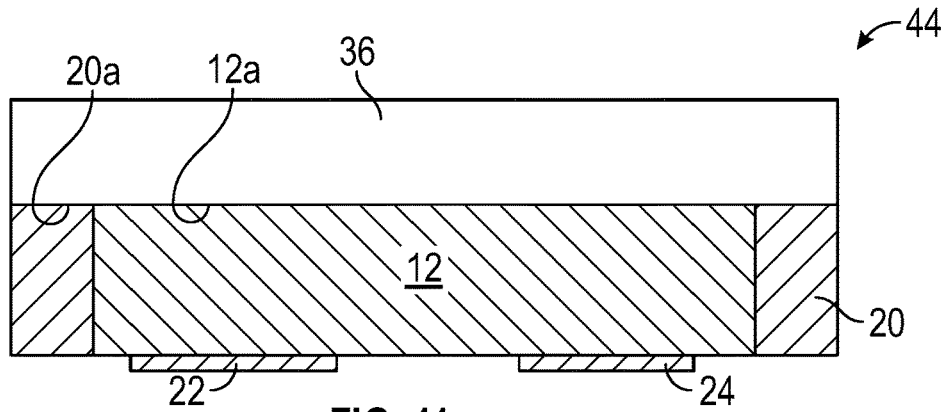
FIG. 11 is a cross-sectional view of an LED device that is similar to the LED device of FIG. 7, but where the lens is arranged on the top face of the LED chip and the top surface of the light-altering material.

FIG. 11 is a cross-sectional view of an LED device 44 that is similar to the LED device 34 of FIG. 7, but where the lens 36 is arranged on the top face 12a of the LED chip 12 and the top surface 20a of the light-altering material 20. As previously described, the lens 36 may comprise a light-transmissive and/or light-transparent material that is similar to the superstrate 16 as previously described. In other embodiments, the lens 36 may comprise silicone and/or glass. The lens 36 may also be textured to improve light extraction or contain materials such as phosphors or scattering particles. The lens 36 may be arranged on the entire top surface 20a of the light-altering material 20 in certain embodiments. In other embodiments, the lens 36 may be partially arranged on the top surface 20a of the light-altering material 20. As illustrated, the lens 36 forms a flat lens above the LED chip 12. In this regard, the LED device 44 may be configured for single color or monochromatic light emissions.

Figure 12:
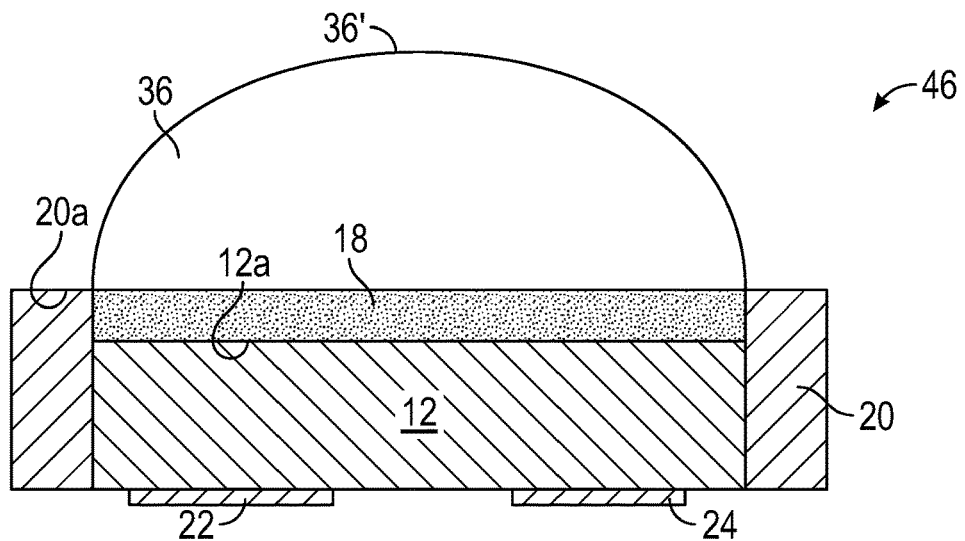
FIG. 12 is a cross-sectional view of an LED device that is similar to the LED device of FIG. 11, but where the lens forms a curved surface above the LED chip.

FIG. 12 is a is a cross-sectional view of an LED device 46 that is similar to the LED device 44 of FIG. 11, but where the lens 36 forms a curved surface 36' above the LED chip 12. In certain embodiments, the lens 36 is generally hemispherical or dome-shaped, although other shapes are possible. As a result, an increased amount of light that reaches the surface 36' of the lens 36 may pass through the lens 36 on a first pass without being redirected back toward the LED chip 12. Additionally, the lens 36 can be useful for directing light emissions in a desired emission pattern. Many different materials can be used for the lens 36, including silicones, plastics, epoxies or glass, with a suitable material being compatible with molding processes. Silicone is suitable for molding and provides acceptable optical transmission properties for light emitted from the LED chip 12. In certain embodiments, the lens 36 may be molded into many different shapes depending on the desired shape of the light output. In addition to hemispherical or dome-shaped, alternative shapes may include ellipsoid bullet, flat, hex-shaped, cubic and square. In certain embodiments, a suitable shape includes both curved and planar surfaces, such as a hemispheric top portion with planar side surfaces. The lens 36 may also be textured to improve light extraction or contain materials such as phosphors or scattering particles. As illustrated, the lumiphoric material 18 is arranged between the lens 36 and the LED chip 12, and the light-altering material 20 is arranged to peripherally surround the lumiphoric material 18. As such, the light-altering material 20 may be configured to direct light emissions from the LED chip 12 and/or light that is converted by the lumiphoric material 18 toward the lens 36. In certain embodiments, the lumiphoric material 18 comprises one or more of a ceramic phosphor plate, phosphor-in-glass, or phosphor embedded in a layer of silicone.

Figure 13:
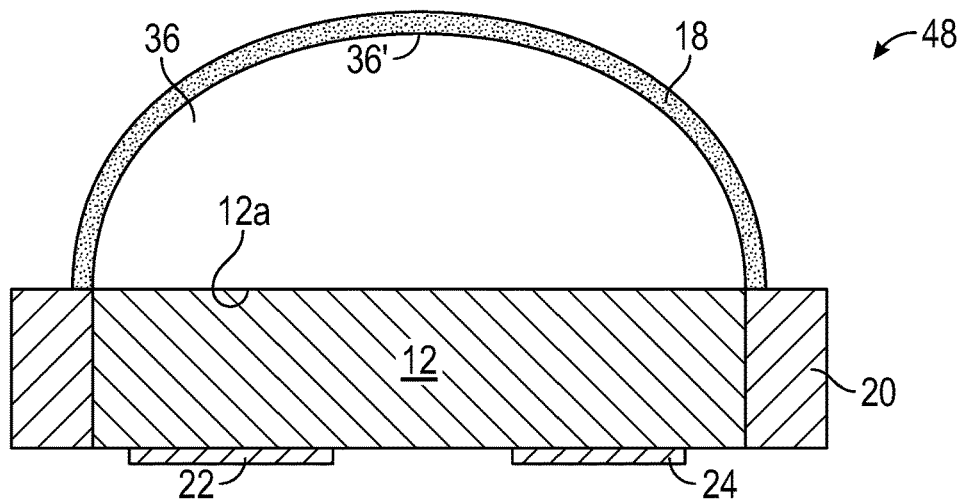
FIG. 13 is a cross-sectional view of an LED device that is similar to the LED device of FIG. 12, but where the lumiphoric material is provided on the surface of the lens.

FIG. 13 is a cross-sectional view of an LED device 48 that is similar to the LED device 46 of FIG. 12, but where the lumiphoric material 18 is provided on the surface 36' of the lens 36. In this regard, the lumiphoric material 18 is provided in a spaced relationship with the LED chip 12, thereby reducing an amount of heat generated by the LED chip 12 from reaching the lumiphoric material 18. In certain embodiments, the lumiphoric material 18 may be formed on the lens 36 by a spraying process where phosphor particles that are mixed in silicone are spray-coated along the surface 36' of the lens 36. In other embodiments, the lumiphoric material 18 may be molded on the lens 36 or the lumiphoric material 18 may be preformed with a shape that is compatible with the surface 36' of the lens 36. As with other embodiments, the light-altering material 20 may be arranged to direct light towards the lens 36.

Figure 14:
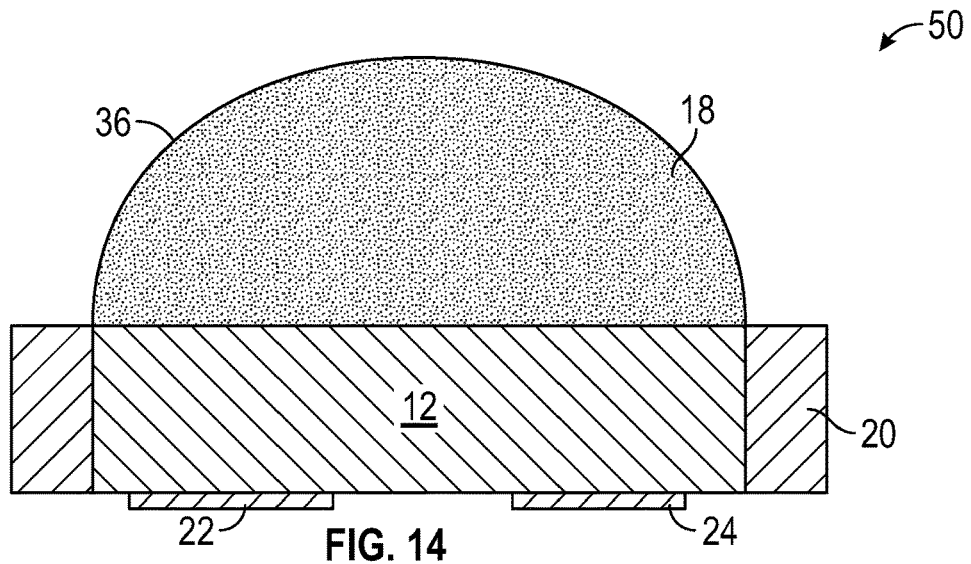
FIG. 14 is a cross-sectional view of an LED device that is similar to the LED device of FIG. 13, but where the lumiphoric material is embedded within the lens.

FIG. 14 is a cross-sectional view of an LED device 50 that is similar to the LED device 48 of FIG. 13, but where the lumiphoric material 18 is embedded within the lens 36. In such embodiments, the lumiphoric material 18 may be mixed with materials of the lens 36 before the shape of the lens 36 is formed. The lens 36 with the lumiphoric material 18 may be molded on the LED chip 12, or the lens 36 with the lumiphoric material 18 may be provided as a preformed structure that is attached to the LED chip 12. As with other embodiments, the light-altering material 20 may be arranged to direct light towards the lens 36.

Figure 15:
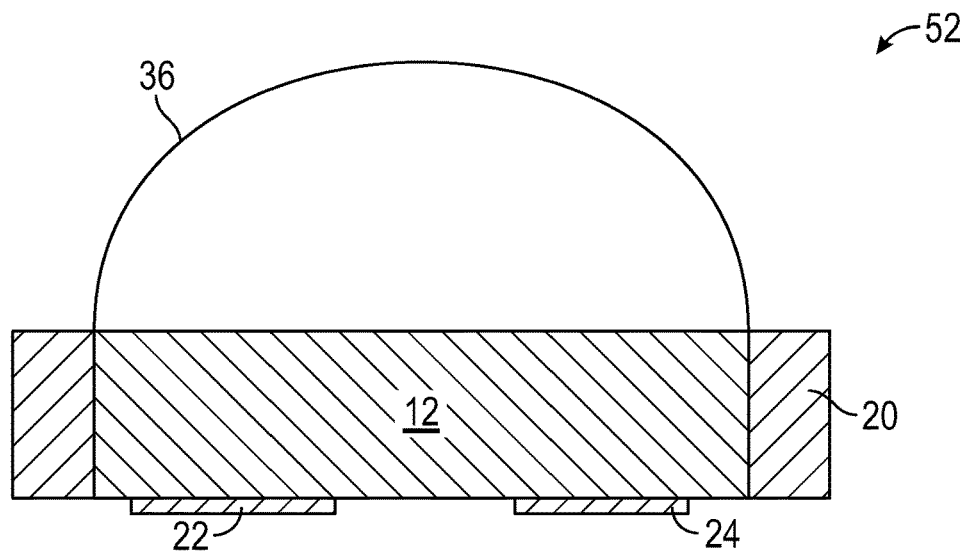
FIG. 15 is a cross-sectional view of an LED device that is similar to the LED device of FIG. 14, but where the lens is devoid of lumiphoric material.

FIG. 15 is a cross-sectional view of an LED device 52 that is similar to the LED device 50 of FIG. 14, but where the lens 36 is devoid of the lumiphoric material 18. In this regard, the LED device 52 may be configured for single color or monochromatic light emissions. As with other embodiments, the light-altering material 20 may be arranged to direct light towards the lens 36.

Figure 16:
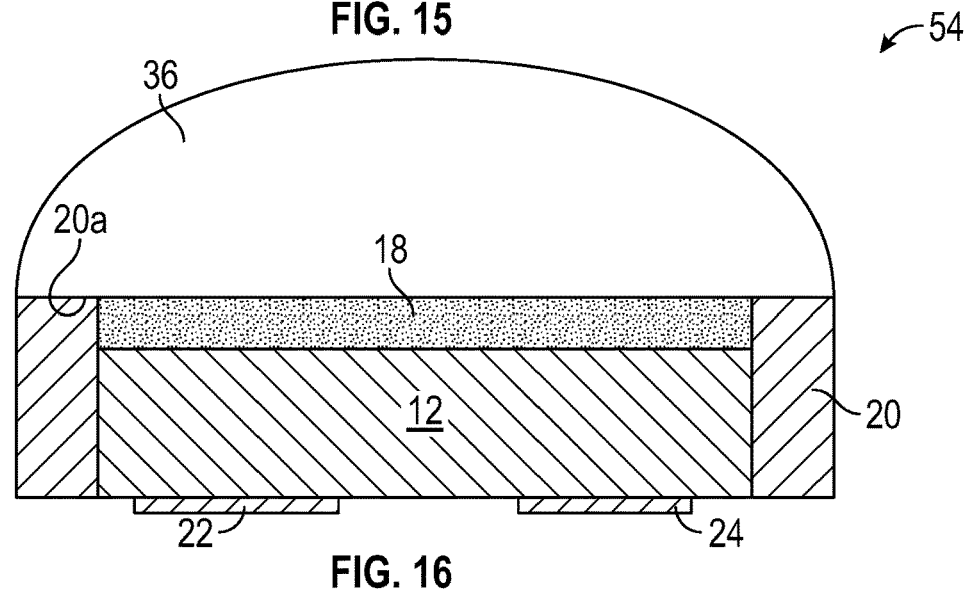
FIG. 16 is a cross-sectional view of an LED device that is similar to the LED device of FIG. 15, but where the lumiphoric material is provided between the LED chip and the lens.

FIG. 16 is a cross-sectional view of an LED device 54 that is similar to the LED device 52 of FIG. 15, but where the lumiphoric material 18 is provided between the LED chip 12 and the lens 36. The LED device 54 is also similar to the LED device 46 of FIG. 12, but where the lens 36 is also provided on the top surface 20a of the light-altering material 20. In this regard, the lumiphoric material 18 is completely surrounded within the LED device 54 by the LED chip 12, the light-altering material 20, and the lens 36. As with other embodiments, this may reduce degradation of the lumiphoric material 18 that may occur if exposed to external environmental conditions.

Figure 17:
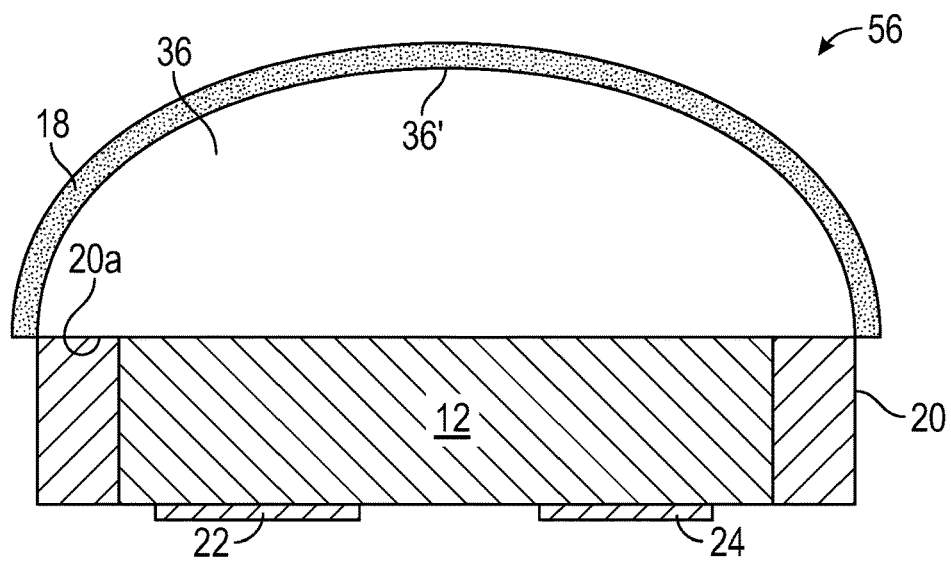
FIG. 17 is a cross-sectional view of an LED device that is similar to the LED device of FIG. 16, but where the lumiphoric material is provided on the surface of the lens.

FIG. 17 is a cross-sectional view of an LED device 56 that is similar to the LED device 54 of FIG. 16, but where the lumiphoric material 18 is provided on the surface 36' of the lens 36. The LED device 56 is also similar to the LED device 48 of FIG. 13, but where the lens 36 is also provided on the top surface 20a of the light-altering material 20. As with other embodiments, this provides a spaced relationship with the LED chip 12, thereby reducing an amount of heat generated by the LED chip 12 from reaching the lumiphoric material 18.

Figure 18:
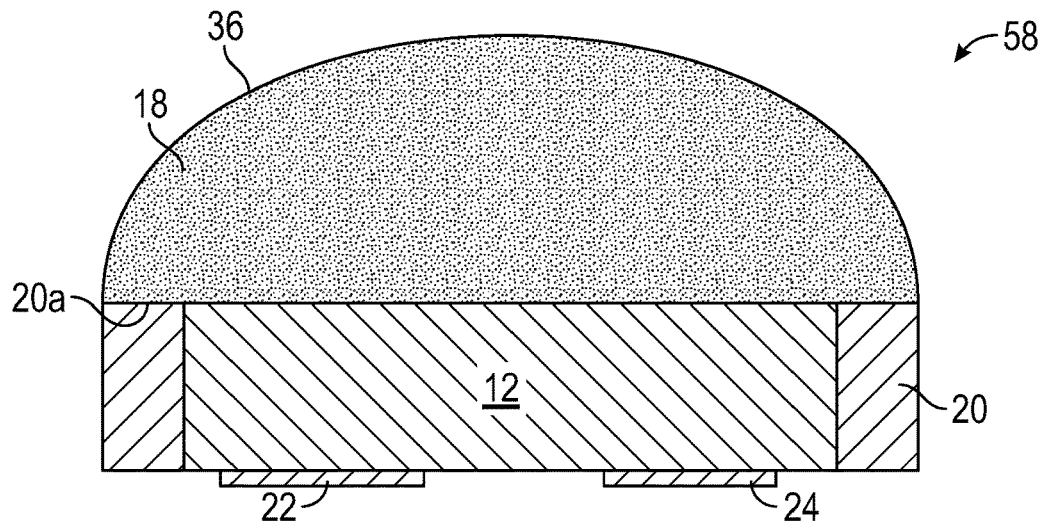
FIG. 18 is a cross-sectional view of an LED device that is similar to the LED device of FIG. 14, but where the lens is also provided on the top surface of the light-altering material.

FIG. 18 is a cross-sectional view of an LED device 58 that is similar to the LED device 50 of FIG. 14, but where the lens 36 is also provided on the top surface 20a of the light-altering material 20. As previously described, the lumiphoric material 18 may be mixed with materials of the lens 36 before the shape of the lens 36 is formed, and the light-altering material 20 may be arranged to direct light towards the lens 36 and the lumiphoric material 18 that is embedded within the lens 36. As illustrated, the lens 36 may be arranged on the entire top surface 20a of the light-altering material 20 in certain embodiments. In other embodiments, the lens 36 may be partially arranged on the top surface 20a of the light-altering material 20.

Figure 19:
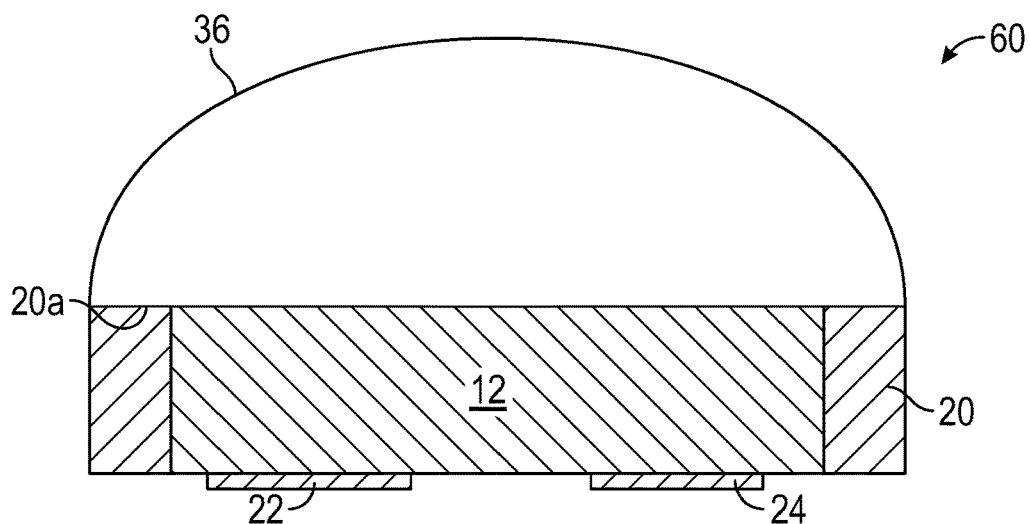
FIG. 19 is a cross-sectional view of an LED device that is similar to the LED device of FIG. 15, but where the lens is also provided on the top surface of the light-altering material.

FIG. 19 is a cross-sectional view of an LED device 60 that is similar to the LED device 52 of FIG. 15, but where the lens 36 is also provided on the top surface 20a of the light-altering material 20. In this regard, the LED device 60 may be configured for single color or monochromatic light emissions. As with other embodiments, the light-altering material 20 may be arranged to direct light towards the lens 36. As illustrated, the lens 36 may be arranged on the entire top surface 20a of the light-altering material 20 in certain embodiments. In other embodiments, the lens 36 may be partially arranged on the top surface 20a of the light-altering material 20.

Figure 20:
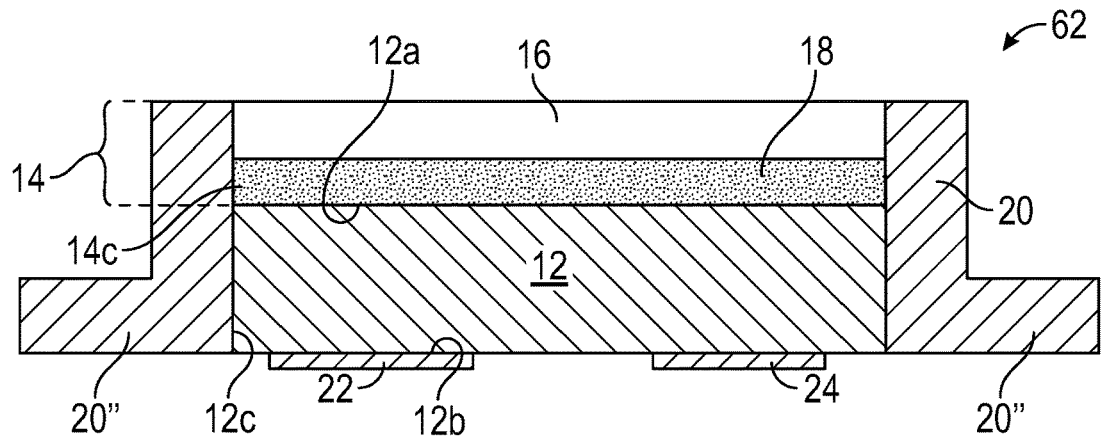
FIG. 20 is a cross-sectional view of an LED device that is similar to the LED device of FIG. 4, but where the light-altering material further comprises extensions that extend away from the sidewalls of the LED chip.

FIG. 20 is a cross-sectional view of an LED device 62 that is similar to the LED device 28 of FIG. 4, but where the light-altering material 20 further comprises extensions 20" that extend away from the sidewalls 12c of the LED chip 12. As previously illustrated in FIGS. 2E and 2F, the extensions 20" of the light-altering material 20 may be formed when the light-altering material 20 is laminated around the LED chip 12 on the temporary carrier (23 of FIG. 2E). In contrast to the LED device 10 as illustrated in FIG. 2G, the LED device 62 may be singulated in a location that is laterally spaced farther away from the LED chip 12. After singulation and removal of the temporary carrier (23 of FIG. 2E), the extensions 20" of the light-altering material 20 may be formed. The extensions 20" may accordingly provide further protection and encapsulation along a base of the LED chip 12. In various embodiments, a bottom surface of the extensions 20" may be coplanar with the bottom face 12b of the LED chip 12 or coplanar with bottom surfaces of the cathode contact 22 and an anode contact 24. The extensions 20" may protrude from other portions of the light-altering material 20 that are on the peripheral sidewalls 12c of the LED chip 12. In certain embodiments, the extensions 20" may form an L-shape in cross section. When the LED device 62 is mounted to an external element, such as a PCB, the extensions 20" may be configured to extend laterally around the LED device 62 and on surfaces of the external element that are adjacent to a mounting surface for the LED chip 12. In this regard, the extensions 20″ may be configured to provide additional encapsulation for portions of the external element on which the LED device 62 is mounted.

Figure 21:
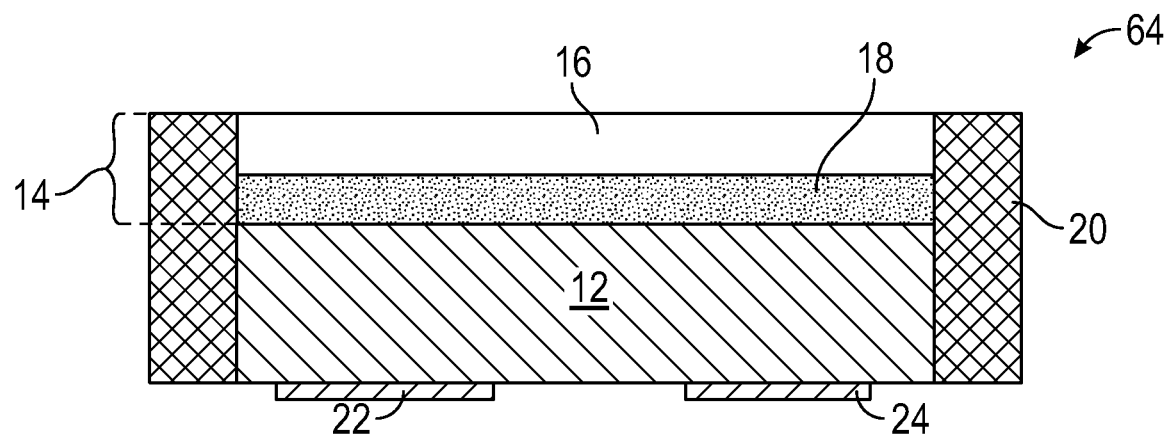
FIG. 21 is a cross-sectional view of an LED device that is similar to the LED device of FIG. 4, but where the light-altering material comprises light-absorbing particles for increased contrast.

FIG. 21 is a cross-sectional view of an LED device 64 that is similar to the LED device 28 of FIG. 4, but where the light-altering material 20 comprises light-absorbing particles for increased contrast. In certain embodiments, the light-altering material 20 comprises a generally opaque or black color for absorbing light. For example, the light-altering material 20 may comprise black particles of carbon (also referred to as carbon black) within a binder such as silicone. In certain embodiments, the light-altering material 20 may include one or more particles that comprise a material such as Si that has a color (e.g. brown or other non-white and non-black colors) that is partially light-absorbing. Accordingly, partially light-absorbing materials may have higher indexes of refraction than black particles for improved light refraction while also comprising a color such as brown that is light-absorbing. A brown color or other non-black or non-white colors may also provide a narrower absorption spectrum than particles that are black. In this regard, non-black or non-white light-absorbing particles may provide some light-absorbing properties to increase contrast while also providing improved brightness when compared to light-absorbing particles that are black.

Figure 22:
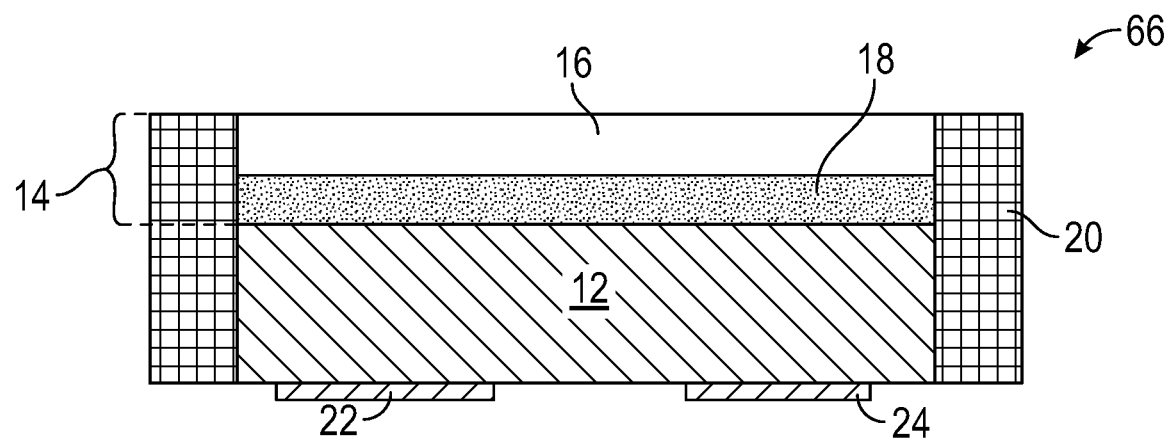
FIG. 22 is a cross-sectional view of an LED device that is similar to the LED device of FIG. 21, but where the light-altering material comprises both light-absorbing particles and light-reflective particles.

FIG. 22 is a cross-sectional view of an LED device 66 that is similar to the LED device 64 of FIG. 21, but where the light-altering material 20 comprises both light-absorbing particles and light-reflective particles. In this regard, the light-altering material 20 may comprise one or more combinations of white particles, black particles, and non-white and non-black particles. The mixture or ratio of light-absorbing particles and light-reflective particles may be tailored to provide different brightness and contrast characteristics for the LED device 66 in different applications.

LED devices as disclosed herein with thin sides formed by light-altering materials may be well suited for various applications where a CSP or low footprint device is needed. Such applications include many different types of LED arrays where LED emitters are provided in close proximity to one another, including display applications or various lighting applications, such as automotive headlights or general lighting fixtures. In addition to LED array applications, LED devices as disclosed herein may be utilized as a single light source with a small footprint and small light-emitting surface that also provides a high candela or lumen output, such as LED torch or flashlight applications.

In certain embodiments, any of the foregoing aspects, and/or various separate aspects and features as described herein, may be combined for additional advantage. Any of the various features and elements as disclosed herein may be combined with one or more other disclosed features and elements unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A light-emitting diode (LED) device comprising:
   at least one LED chip comprising a top face, a bottom face, and peripheral sidewalls that bound the top face and the bottom face;
   a wavelength conversion element arranged on the top face of the at least one LED chip, the wavelength conversion element comprising at least one lumiphoric material; and
   a light-altering material arranged on the peripheral sidewalls of the at least one LED chip, the light-altering material comprising a width as measured from the peripheral sidewalls that is in a range from 15 microns (μm) to 100 μm, wherein the light-altering material is further arranged to extend from the peripheral sidewalls of the at least one LED chip along peripheral side surfaces of the wavelength conversion element to a position that is adjacent a top face of the wavelength conversion element, wherein the top face of the at least one LED chip is devoid of the light-altering material.

2. The LED device of claim 1, wherein the width of the light-altering material is in a range from 15 μm to 50 μm.

3. The LED device of claim 1, wherein the bottom face of the at least one LED chip is devoid of the light-altering material.

4. The LED device of claim 1 wherein the light-altering material comprises a light-reflective material.

5. The LED device of claim 4 wherein the light-reflective material comprises fused silica, fumed silica, or titanium dioxide ($TiO_2$) particles suspended in silicone.

6. The LED device of claim 1 wherein the light-altering material comprises a light-absorbing material.

7. The LED device of claim 1, wherein the LED device is devoid of a submount on the bottom face of the at least one LED chip.

8. The LED device of claim 1, further comprising an anode and a cathode on the bottom face of the at least one LED chip.

9. The LED device of claim 1, wherein the wavelength conversion element further comprises a superstrate that supports the at least one lumiphoric material.

10. The LED device of claim 1, wherein the wavelength conversion element comprises one of a ceramic phosphor plate, phosphor-in-glass, or phosphor embedded in silicone.

11. The LED device of claim 1, wherein the peripheral side surfaces of the wavelength conversion element are offset from the peripheral sidewalls of the at least one LED chip.

12. The LED device of claim 11, wherein the light-altering material is conformal on the peripheral side surfaces of the wavelength conversion element and the peripheral sidewalls of the at least one LED chip.

13. The LED device of claim 1, wherein the light-altering material forms rounded corners at peripheral edge corners of the wavelength conversion element.

14. The LED device of claim 1, wherein the light-altering material forms rounded corners at peripheral sidewall corners of the at least one LED chip.

15. The LED device of claim 1, wherein the light-altering material forms extensions that extend away from the peripheral sidewalls of the at least one LED chip.

16. The LED device of claim 1, further comprising a lens on the at least one LED chip.

17. A light-emitting diode (LED) device comprising:
   at least one LED chip comprising a top face, a bottom face, and peripheral sidewalls that bound the top face and the bottom face;
   a light-altering material arranged on the peripheral sidewalls of the at least one LED chip, the light-altering material comprising a width as measured from the peripheral sidewalls that is in a range from 15 microns (μm) to 100 μm; and
   a light-transmissive material arranged on the top face of the at least one LED chip, wherein the light-altering material is further arranged to extend along peripheral side surfaces of the light-transmissive material such that a top surface of the light-altering material is coplanar with a top surface of the light-transmissive material, and wherein the light-transmissive material comprises a lens that includes silicone, plastic, epoxy, or glass.

18. The LED device of claim 17, wherein the light-altering material comprises a light-reflective material.

19. The LED device of claim 17, wherein the light-altering material comprises a light-absorbing material.

20. The LED device of claim 17, wherein the LED device is devoid of a submount on the bottom face of the at least one LED chip.

21. The LED device of claim 17, wherein the light-transmissive material is a support element of a wavelength conversion element arranged on the top face of the at least one LED chip, the wavelength conversion element comprising at least one lumiphoric material.

22. The LED device of claim 21, wherein the lumiphoric material comprises phosphor embedded in silicone.

23. The LED device of claim 21, wherein peripheral side surfaces of the wavelength conversion element are offset from the peripheral sidewalls of the at least one LED chip.

24. The LED device of claim 23, wherein the light-altering material is conformal on the peripheral side surfaces of the wavelength conversion element and the peripheral sidewalls of the at least one LED chip such that the light-altering material forms a curved transition between the peripheral side surfaces of the wavelength conversion element and the peripheral sidewalls of the at least one LED chip.

* * * * *